United States Patent
Seo et al.

(10) Patent No.: US 7,192,804 B2
(45) Date of Patent: Mar. 20, 2007

(54) SEMICONDUCTOR DEVICE AND METHOD FOR FABRICATING THE SAME

(75) Inventors: Satoshi Seo, Kyoto (JP); Takayuki Matsuda, Kyoto (JP); Takahiro Minamide, Niigata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/607,274

(22) Filed: Jun. 27, 2003

(65) Prior Publication Data

US 2004/0038448 A1 Feb. 26, 2004

(30) Foreign Application Priority Data

Jun. 27, 2002 (JP) .............................. 2002-187220

(51) Int. Cl.
*H01L 21/00* (2006.01)

(52) U.S. Cl. .................... 438/113; 438/114; 438/118

(58) Field of Classification Search ............... 438/106, 438/115, 118, 459, 113, 114; 257/730, 783
See application file for complete search history.

(56) References Cited

U.S. PATENT DOCUMENTS

| | | | | |
|---|---|---|---|---|
| 5,463,246 A | * | 10/1995 | Matsunami | ............... 257/621 |
| 6,097,087 A | * | 8/2000 | Farnworth et al. | .......... 257/698 |
| 6,214,441 B1 | * | 4/2001 | Liu et al. | .................... 428/156 |
| 6,576,381 B1 | * | 6/2003 | Hirano et al. | ................. 430/11 |
| 6,582,983 B1 | * | 6/2003 | Runyon et al. | ............... 438/33 |
| 6,607,970 B1 | * | 8/2003 | Wakabayashi | .............. 438/462 |
| 6,699,735 B2 | * | 3/2004 | Ohuchi et al. | ............. 438/113 |
| 7,053,479 B2 | * | 5/2006 | Terashima | .................. 257/689 |
| 2002/0020855 A1 | * | 2/2002 | Hwang | ....................... 257/200 |
| 2002/0148733 A1 | * | 10/2002 | Saito et al. | .................. 205/126 |
| 2002/0185721 A1 | * | 12/2002 | Hwang et al. | ............. 257/678 |
| 2002/0197771 A1 | * | 12/2002 | Dotta et al. | ................. 438/114 |
| 2003/0001283 A1 | * | 1/2003 | Kumamoto | ................. 257/778 |

FOREIGN PATENT DOCUMENTS

| | | |
|---|---|---|
| JP | 11-87282 A | 3/1999 |
| JP | 2001-274129 A | 10/2001 |
| JP | 2002-22057 A | 1/2002 |
| JP | 2002-201442 A | 7/2002 |

\* cited by examiner

*Primary Examiner*—Matthew Smith
*Assistant Examiner*—Khiem Nguyen
(74) *Attorney, Agent, or Firm*—McDermott Will & Emery LLP

(57) ABSTRACT

A wafer on which semiconductor elements, a multilevel interconnect layer, a bonding pad, a passivation film, and the like are formed is coated with a buffer coat film. Thereafter, the buffer coat film is patterned by exposure and development so that parts of the buffer coat film located on the bonding pads and scribe line regions and a part of the buffer coat film located on a periphery region of the wafer are removed, thereby forming apertures. The rear surface of the wafer is polished by polishing slurry with a surface protection tape bonded to the surface of the wafer by adhesive paste. In the periphery region, the apertures including the scribe line regions are blocked by the adhesive paste so that polishing slurry does not permeate.

10 Claims, 22 Drawing Sheets

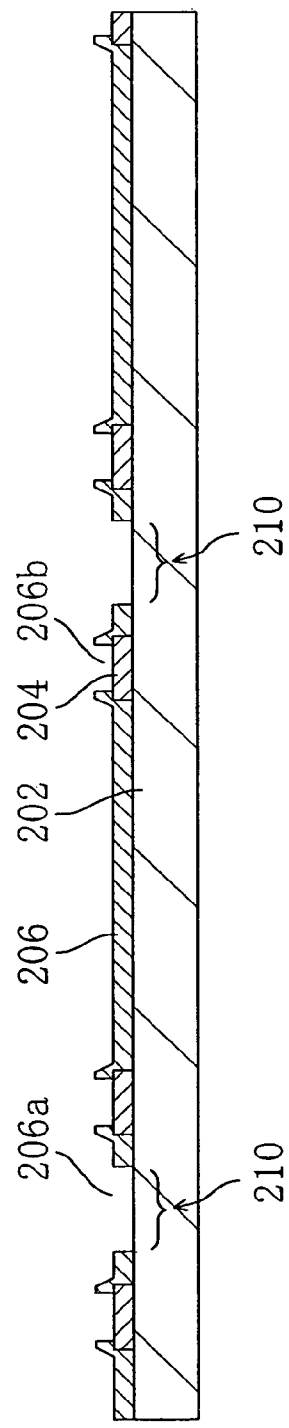
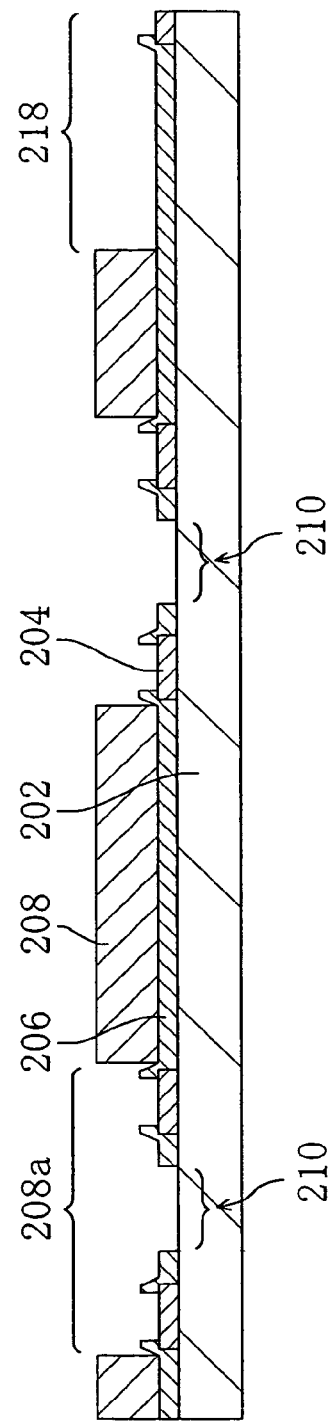
FIG. 1A
FIG. 1B

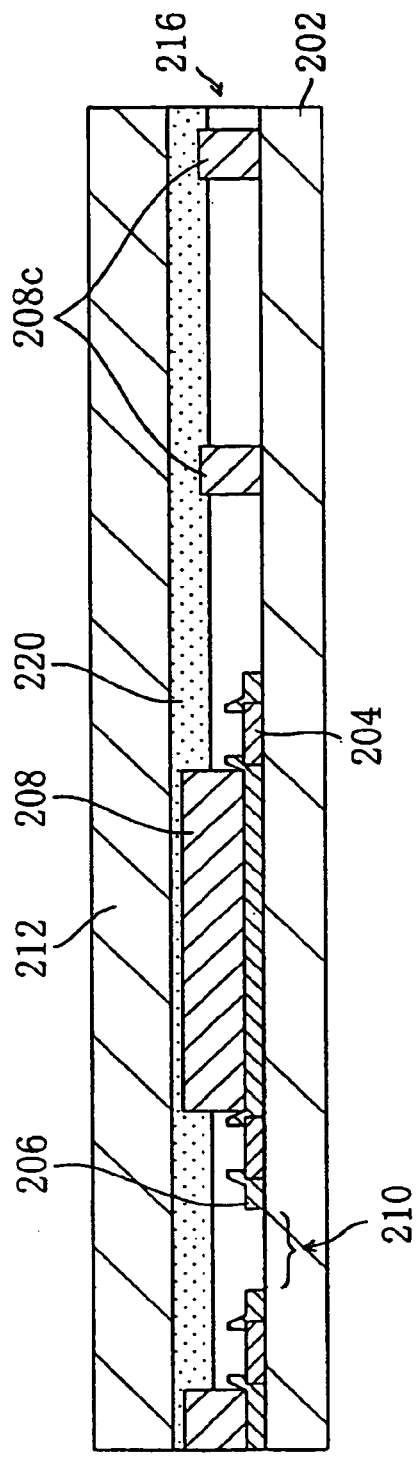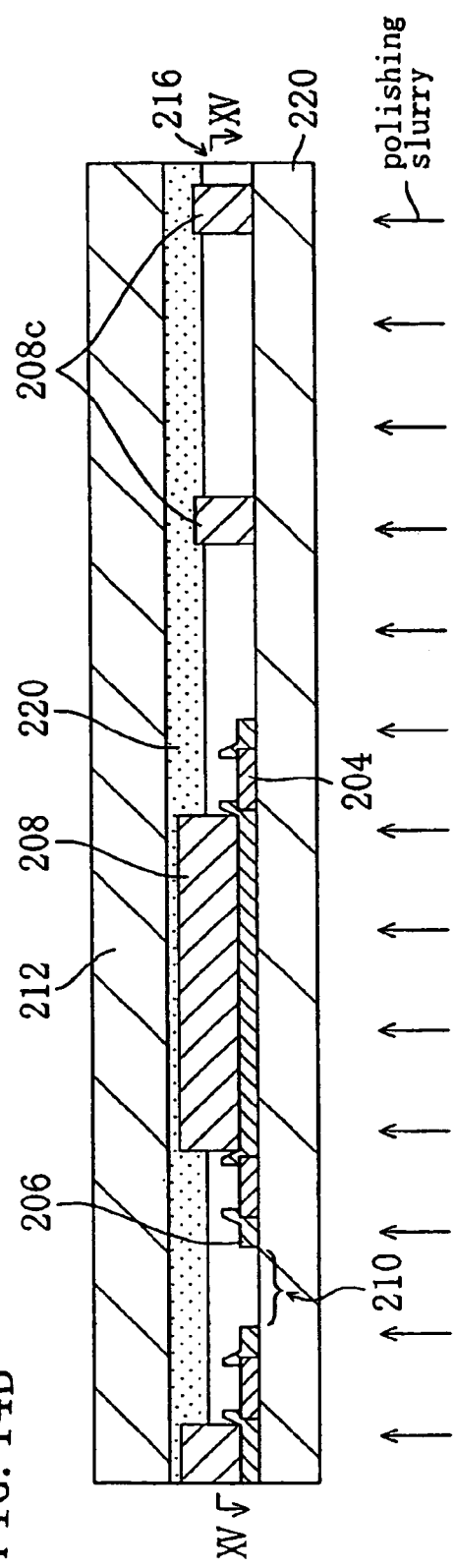
FIG. 14A
FIG. 14B

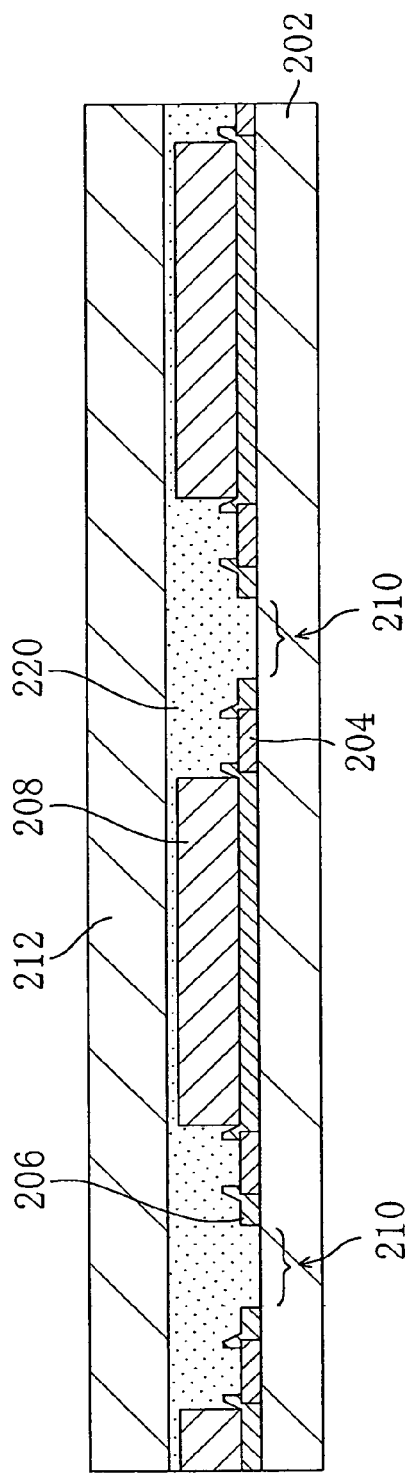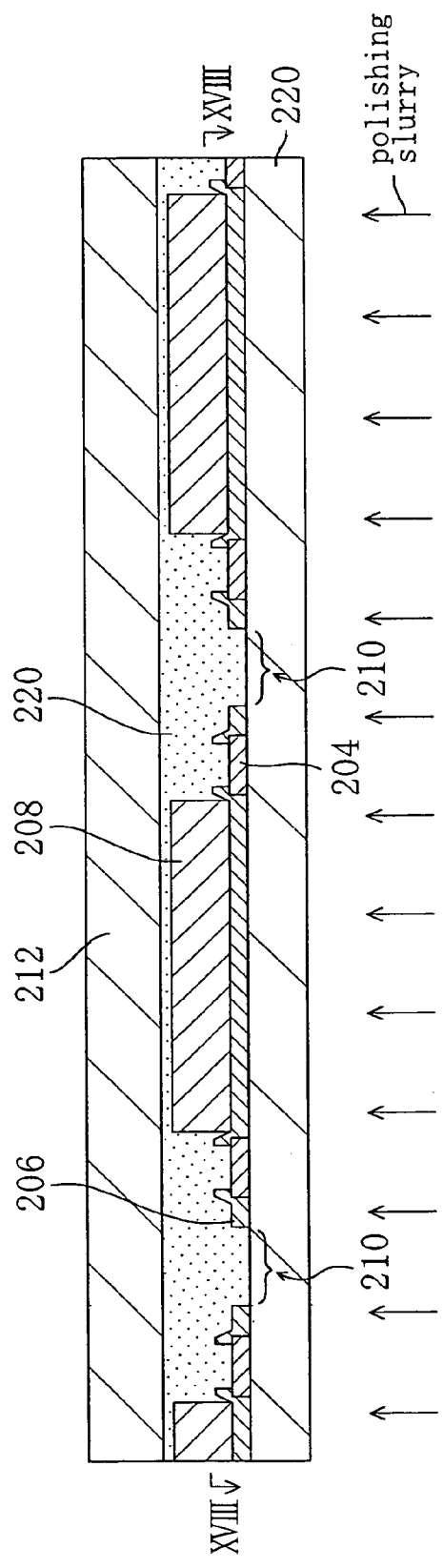

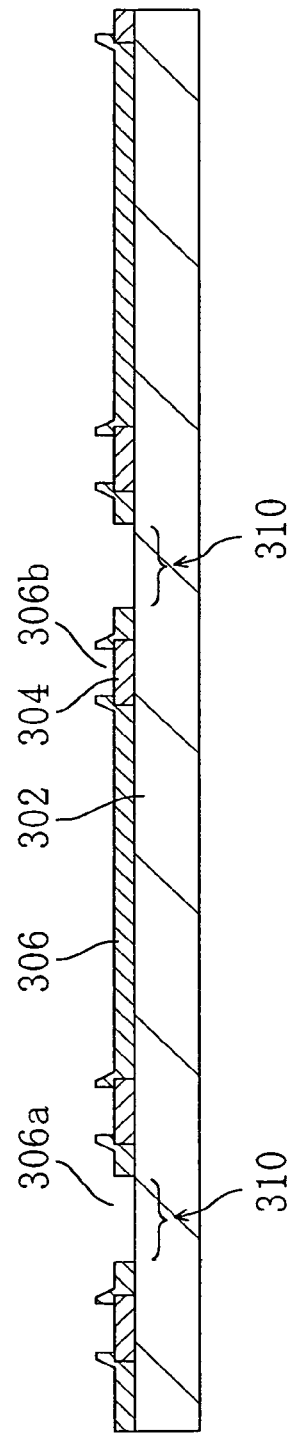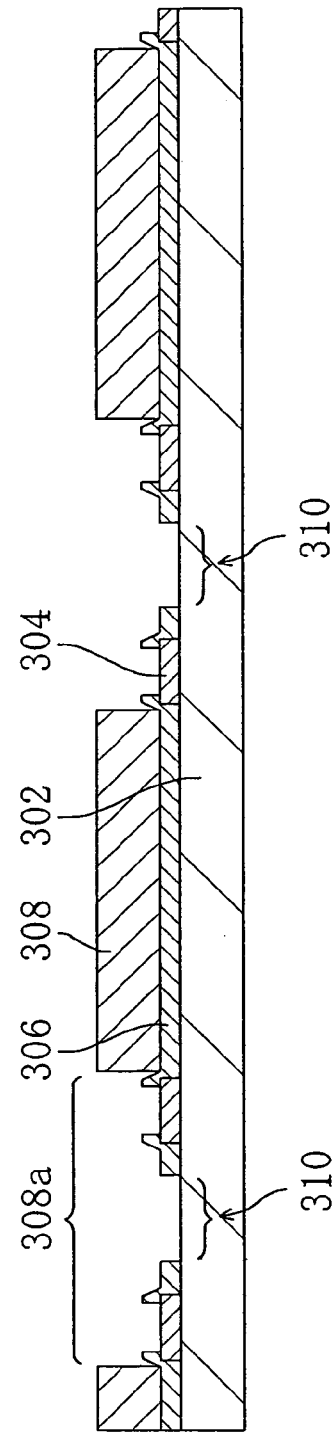
FIG. 20A PRIOR ART
FIG. 20B PRIOR ART

SEMICONDUCTOR DEVICE AND METHOD FOR FABRICATING THE SAME

BACKGROUND OF THE INVENTION

The present invention relates to a semiconductor device including a buffer coat film formed on a passivation film and a method for fabricating the same.

FIGS. 20A to 21B are cross sectional views taken along the line XX—XX in FIG. 22 and showing process steps for fabricating a known semiconductor device. FIG. 22 is a plan view showing a periphery region of a wafer in a process step shown in FIG. 21B with part of the periphery region being taken along the line XXII—XXII.

First, in the process step shown in FIG. 20A, a conductive film made of an aluminum alloy film is deposited above a wafer 302 on which semiconductor elements (not shown) such as transistors are formed and then a multilevel interconnect layer (not shown) is formed above the semiconductor elements, for example, by sputtering. Thereafter, the conductive film is patterned by lithography and dry etching so that bonding pads 304 are formed. Each of the bonding pads 304 is connected to the semiconductor element located below via an interconnect, a plug or the like. Next, a passivation film 306 made of a silicon nitride film is deposited above the wafer 302 by CVD (chemical vapor deposition), so as to cover the bonding pads 304. Thereafter, apertures 306a and 306b each having a predetermined shape are formed, by lithography and dry etching, in portions of the passivation film 306 located on each scribe line region 310 and each bonding pad 304, respectively.

Next, in the process step shown in FIG. 20B, a buffer coat film 308 of approximately 6 μm thickness made of a photosensitive material is formed above the substrate by a spin coating method. Thereafter, parts of the buffer coat film 308 respectively located on the bonding pads 304 and the scribe line regions 310 are removed by lithography, thereby forming apertures 308a. As a result, the buffer coat film 308 is left on regions of the passivation film 306 (transistor formation regions) each surrounded by a certain number of bonding pads 304.

Next, in the process step shown in FIG. 21A, a surface protection tape 312 is bonded to the top of the wafer, above which the buffer coat film 308 is formed, using adhesive paste 320 adhered to the rear surface of the surface protection tape 312. The adhesive paste 320 has a thickness of 15 μm.

Next, in the process step shown in FIG. 21B, the rear surface of the wafer 302 is polished using the surface protection tape 312 as a protection film until the wafer has a predetermined thickness. This polishing process is performed using polishing slurry obtained by dispersing abrasives into liquid, and the generated swarf is eliminated together with the polishing slurry.

Thereafter, after removing the surface protection tape 312, the scribe line regions 310 of the wafer 302 are scribed to divide the wafer into individual chips, and each chip is assembled into a semiconductor device.

However, it has been found that, in the above-mentioned known method for fabricating a semiconductor device, the polishing slurry, including the swarf generated in the rear surface polishing process step, adheres to the surfaces of the bonding pads located on the periphery region of the wafer, resulting in a decrease in the fabrication yield of the semiconductor devices. The inventors have found, as a result of their various studies, that the fabrication yield of the semiconductor devices is decreased due to the following action.

As shown in FIG. 21B, there exist gaps between the wafer 302 and the adhesive paste 320 in the aperture 308a regions provided in the buffer coat film 308. Therefore, as shown in FIG. 22, it is considered that the liquid including the swarf generated in the rear surface polishing process step permeates from the periphery of the wafer 302 toward the center of the wafer 302 along the gaps located in the apertures 308a in a permeating direction 316 shown by the arrow, and the permeating liquid adheres to the surfaces of the bonding pads 304.

SUMMARY OF THE INVENTION

An object of the present invention is to provide a high-bonding-reliability semiconductor device and a method for fabricating the same which can prevent the contamination of bonding pads caused by permeation of polishing slurry used in a rear surface polishing process step from the periphery of a wafer.

The method for fabricating a semiconductor device of the present invention provides for the method comprising the steps of forming bonding pads, a passivation film and a buffer coat film above a wafer on which semiconductor elements and an interconnect layer are formed, bonding a surface protection tape to the wafer using an adhesive material and then polishing the rear surface of the wafer, and takes measures for preventing polishing slurry from permeating from apertures of the buffer coat film including scribe lines of the wafer to the inside.

The specific methods therefor are as follows.

The apertures of the buffer coat film are extended to the periphery region of the wafer, thereby blocking the apertures of the buffer coat film including the scribe lines on the periphery region of the wafer by the adhesive material. Therefore, the polishing slurry can be prevented from permeating into the inside in the rear surface polishing step.

A method in which part of the buffer coat film located on the periphery region of the wafer is thinned can be also used to block the apertures of the buffer coat film including the scribe lines on the periphery region of the wafer or become in a state where they are almost blocked. Therefore, the polishing slurry can be prevented from permeating into the inside in the rear surface polishing step.

A method in which a thick adhesive paste is employed as an adhesive material can be also used to block the apertures of the buffer coat film including the scribe lines on the periphery region of the wafer or become in a state where they are almost blocked. Therefore, the polishing slurry can be prevented from permeating into the inside in the rear surface polishing step.

A method in which polishing slurry having a high viscosity is employed can be also used to prevent the polishing slurry from permeating into the inside in the rear surface polishing process.

A structure or a method in which apertures are formed in the buffer coat film with connection parts connecting between chip regions left can be also used to block the apertures of the buffer coat film including the scribe lines on the periphery region of the wafer on their way. Therefore, the polishing slurry can be prevented from permeating into the inside in the rear surface polishing step.

BRIEF DESCRIPTION OF THE DRAWINGS

FIGS. 1A and 1B are cross sectional views taken along the line I—I in FIG. 3 and showing the first half of process steps for fabricating a semiconductor device according to a first embodiment.

FIGS. 14A and 14B are cross sectional views taken along the line XIII—XIII in FIG. 15 and showing the second half of process steps for fabricating a semiconductor device according to the fifth embodiment.

FIGS. 17A and 17B are cross sectional views taken along the line XVI—XVI in FIG. 18 and showing the second half of process steps for fabricating a semiconductor device according to the sixth embodiment.

FIGS. 20A and 20B are cross sectional views taken along the line XX—XX in FIG. 22 and showing the first half of process steps for fabricating a known semiconductor device.

DESCRIPTION OF THE PREFERRED EMBODIMENTS (Embodiment 1)

Figure 2A:
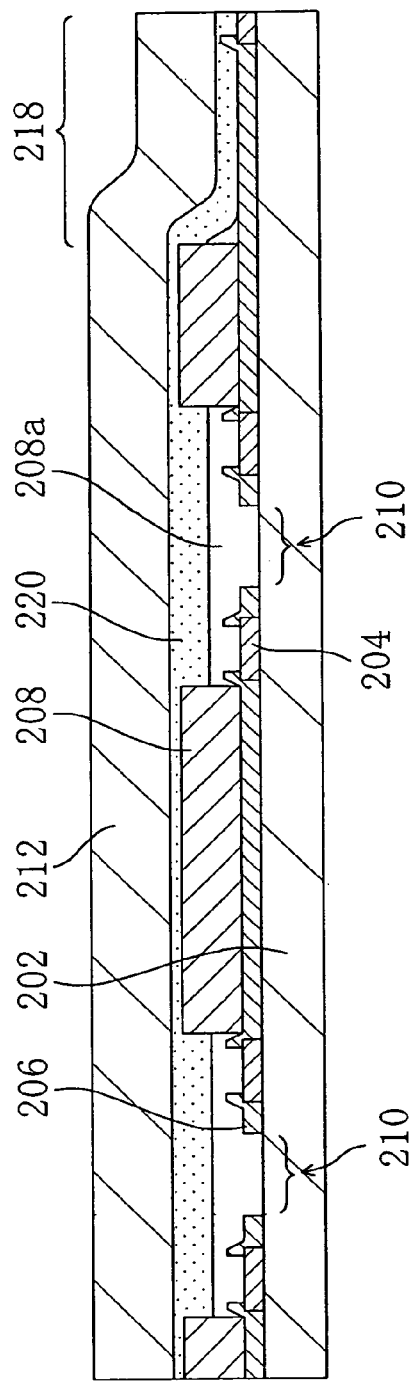
FIGS. 2A and 2B are cross sectional views taken along the line I—I in FIG. 3 and showing the second half of process steps for fabricating a semiconductor device according to the first embodiment.
Figure 2B:
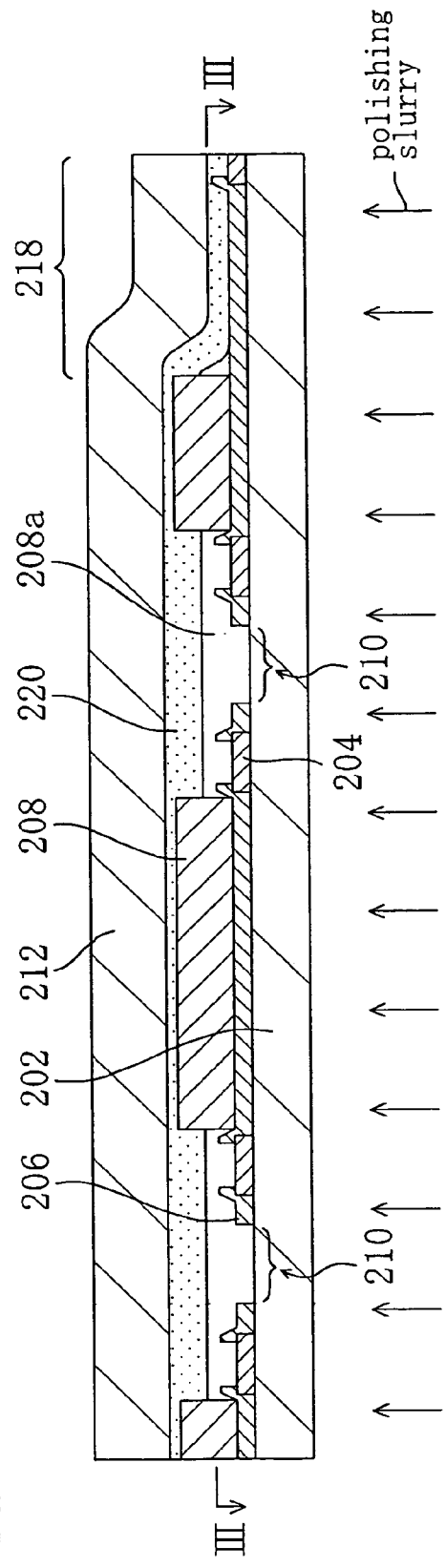
Figure 3:
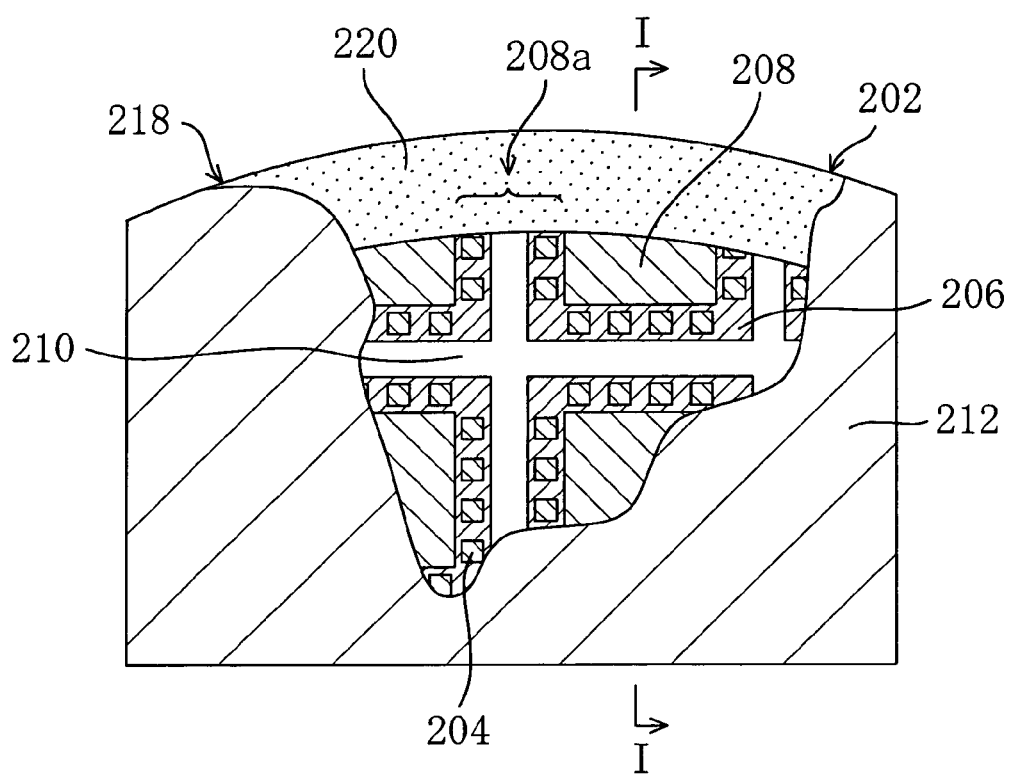
FIG. 3 is a plan view showing a periphery region of a wafer in the process step shown in FIG. 2B with part of the periphery region being taken along the line III—III.

FIGS. 1A to 2B are cross sectional views taken along the line I—I in FIG. 3 and showing process steps for fabricating a semiconductor device according to a first embodiment. FIG. 3 is a plan view showing a periphery region of a wafer in the process step shown in FIG. 2B with part of the periphery region being taken along the line III—III.

First, in the process step shown in FIG. 1A, a conductive film made of an aluminum alloy film is deposited above a wafer 202 (semiconductor substrate) on which semiconductor elements (not shown) such as transistors are formed and then a multilevel interconnect layer (not shown) is formed above the semiconductor elements, for example, by sputtering. Thereafter, the conductive film is patterned by lithography and dry etching so that bonding pads 204 are formed. Each of the bonding pads 204 is connected to the semiconductor element located below via an interconnect, a plug or the like. Next, a passivation film 206 made of a silicon nitride film is deposited above the wafer 202 by CVD (chemical vapor deposition), so as to cover the bonding pads 204. Thereafter, apertures 206a including regions of the passivation film 206 located above scribe line regions of the wafer and apertures 206b including regions of the passivation film 206 located above parts of the bonding pads 204 are formed in the passivation film 206 by lithography and dry etching.

Next, in the process step shown in FIG. 1B, a buffer coat film 208 of approximately 6 μm thickness made of polybenzoxazole (PBO) as a positive-type photosensitive material is formed over the whole substrate by a spin coating method. Thereafter, parts of the buffer coat film 208 respectively located on the bonding pads 204 and the scribe line regions 210 are removed by lithography, thereby forming apertures 208a. Concurrently, a part of the buffer coat film 208 located on the periphery region 218 with a width of 3 mm from the edge of the wafer 202 as shown in FIG. 3 is also removed. As a result, the buffer coat film 208 never exists in the periphery region 218 but is left on the regions of the passivation film 206 (transistor formation regions) each surrounded by a certain number of the bonding pads 204. Variations in timings for removing part of the buffer coat film 208 located on the periphery region 218 and methods therefor will be described in detail later.

Next, in the process step shown in FIG. 2A, a surface protection tape 212 is bonded to the top of the wafer, above which the buffer coat film 208 is formed, using adhesive paste 220 adhered to the rear surface of the surface protection tape 212. The adhesive paste 220 has a thickness of 15 μm.

Next, in the process step shown in FIG. 2B, the rear surface of the wafer 202 is polished using the surface protection tape 212 as a protection film until the wafer has a predetermined thickness. This polishing process is performed using polishing slurry obtained by dispersing abrasives into liquid, and the generated swarf is eliminated together with the polishing slurry.

Thereafter, after removing the surface protection tape 212, the scribe line regions 210 of the wafer 202 are scribed to divide the wafer into individual chips, and each chip is assembled into a semiconductor device.

According to the method for fabricating a semiconductor device of this first embodiment, a part of the buffer coat film 208 located on the periphery region 218 is removed, thereby, as shown in FIG. 3, bonding the surface protection tape 212 to the passivation film 206 and the scribe line regions 210 in the wafer periphery region 218 by the adhesive paste 220 without creating a gap from them. Therefore, the polishing slurry used for the process step shown in FIG. 2B (rear surface polishing process step) can be prevented from permeating into the apertures 208a (scribe line regions 210) of the buffer coat film 208 due to capillarity. This avoids contamination of the bonding pads 204 of the wafer 202 which would be caused by contact with the polishing slurry including swarf.

First Example of Periphery Region Buffer Coat Film Removal Method

Figure 19A:
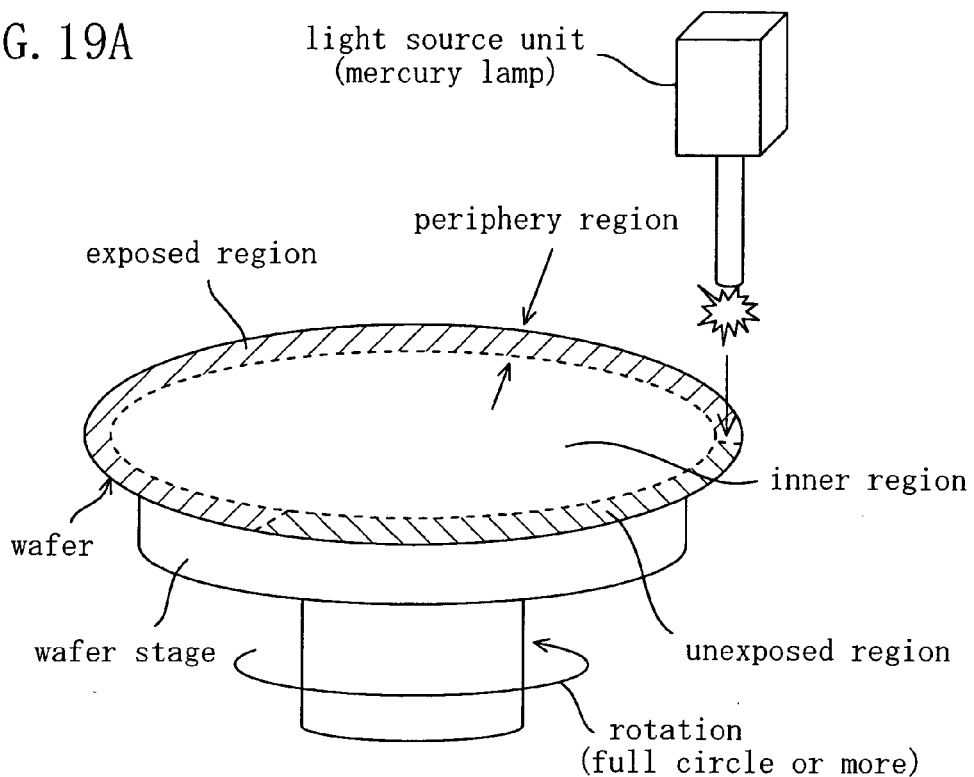
FIGS. 19A and 19B are perspective views showing methods for removing part of a buffer coat film located on the periphery region of the wafer according to first and second examples.

FIG. 19A is a perspective view showing a method for removing part of the buffer coat film 208 located on the periphery region 218 by using a mercury lamp according to a first example.

As shown in FIG. 19A, while the wafer is rotated with it mounted on a wafer stage, part of the buffer coat film 208 located on the periphery region 218 is irradiated with light (exposed). The exposure timings have following variations.

When the buffer coat film 208 is formed using a positive-type photosensitive material, following procedures are possible.

In the first procedure, the wafer is coated with the photosensitive material, and then a post-coat bake is performed. Thereafter, the pattern exposure is carried out to form the apertures 208a. Next, the periphery region is exposed as shown in FIG. 19A and then a post-exposure bake is carried out. Thereafter, a post-development bake is performed.

In the second procedure, the wafer is coated with the photosensitive material, and then a post-coat bake is performed. Thereafter, the periphery region is exposed as shown in FIG. 19A. Next, the pattern exposure is carried out to form the apertures 208a and then a post-exposure bake is carried out. Thereafter, a post-development bake is performed.

Typically, the second procedure is the more preferable of the first and second procedures. This reason is as follows: it is preferable that the time interval between the exposure and the post-exposure bake is as short as possible. However, since the inner region is more important than the periphery region, the inner region is preferably exposed, if possible, immediately before the post-exposure bake.

Second Example of Periphery Region Butter Coat Film Removal Method

Figure 19B:
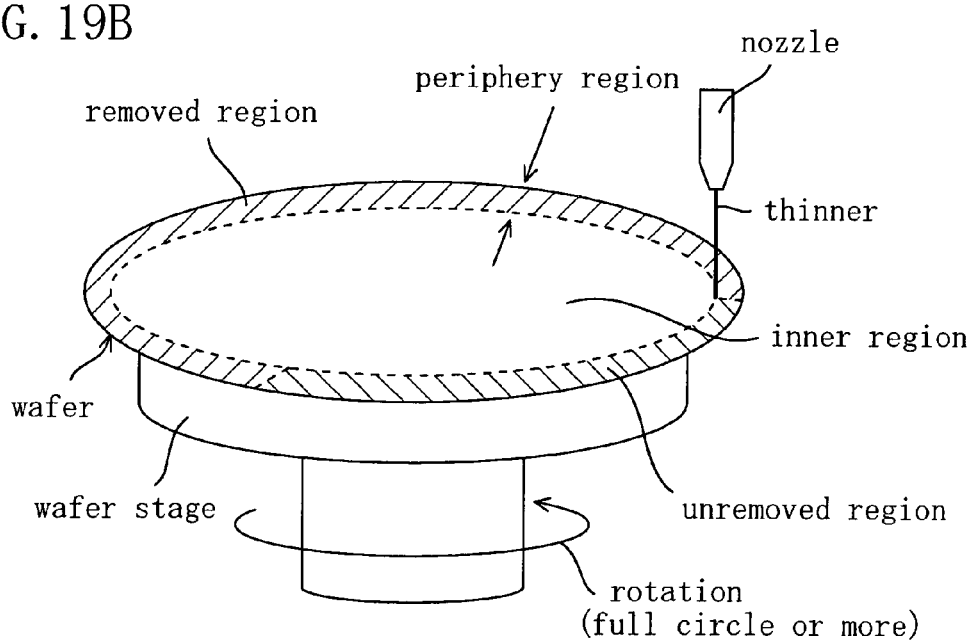
Figure 21A:
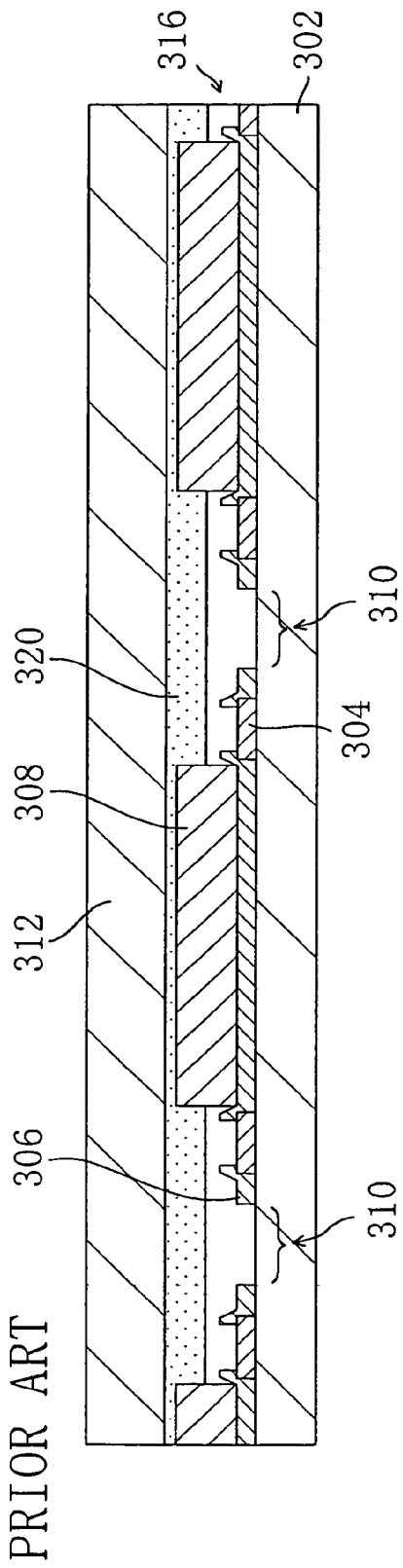
FIGS. 21A and 21B are cross sectional views taken along the line XX—XX in FIG. 22 and showing the second half of process steps for fabricating a known semiconductor device.
Figure 21B:
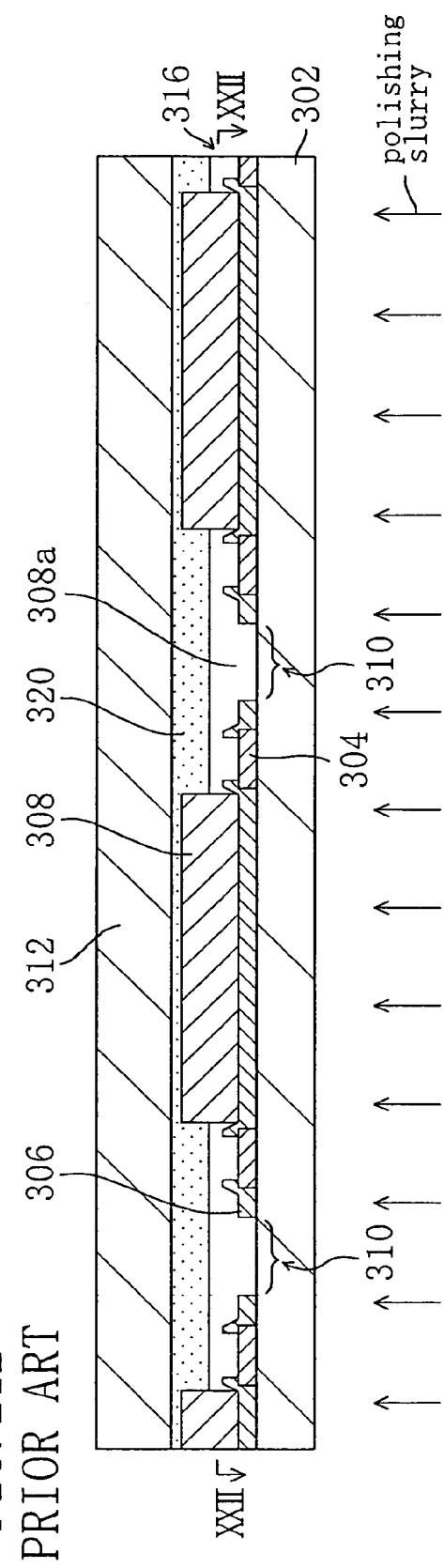

FIG. 19B is a perspective view showing a method for removing part of the buffer coat film 208 located on the periphery region 218 by a thinner according to a second example. As shown in FIG. 19B, while the wafer is rotated with it mounted on a wafer stage, the thinner is dropped on part of the buffer coat film 208 located on the periphery region 218. After the wafer is coated with the photosensitive material and then the post-exposure bake is performed, the thinner can be dropped anytime.

Other Example of Periphery Region Buffer Coat Film Removal Method

It is also technically possible to form a buffer coat film 208 using a material other than the photosensitive material. In this case, it is necessary to allow an etching agent of the material to act on the wafer in such a manner as shown in FIG. 19B.

As will be described in a third embodiment, the wafer may be coated with the buffer coat film, and thereafter nitrogen or air may be blown on the Periphery region 218 of the wafer before exposure. Thus, a part of the buffer coat film 208 located on the Periphery region 218 can be removed.

(Embodiment 2)

Figure 4A:
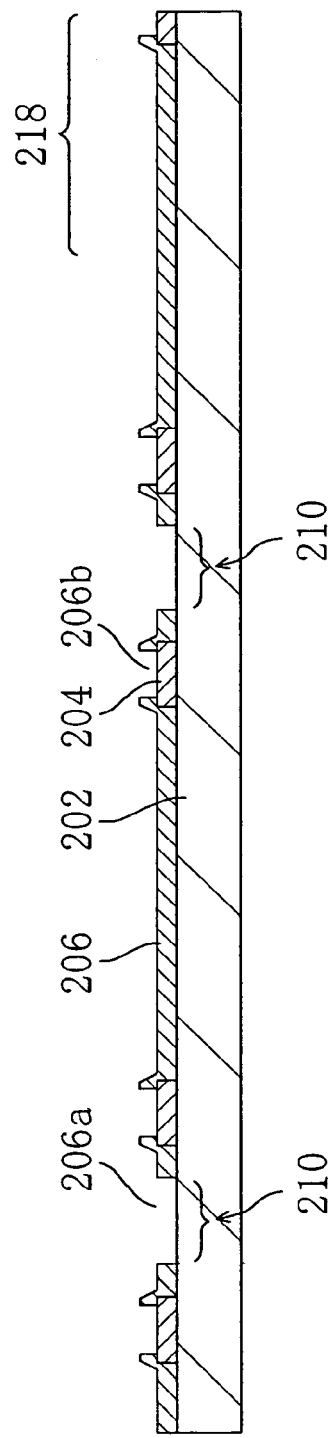
FIGS. 4A and 4B are cross sectional views taken along the line IV—IV in FIG. 6 and showing the first half of process steps for fabricating a semiconductor device according to a second embodiment.
Figure 4B:
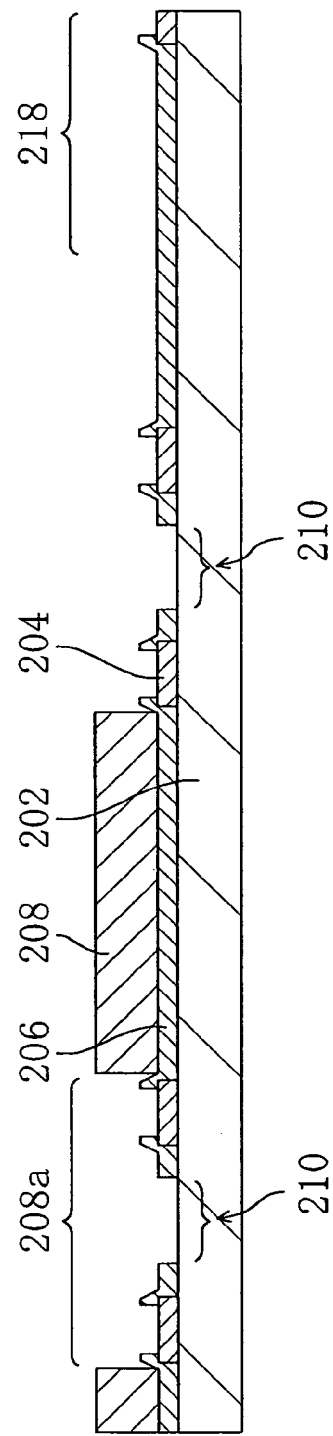
Figure 5A:
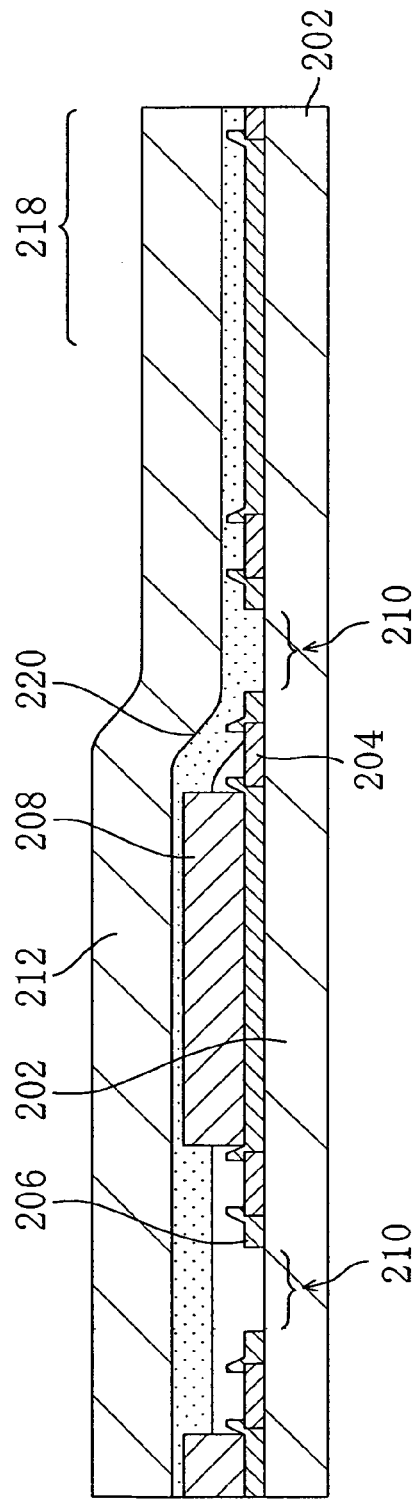
FIGS. 5A and 5B are cross sectional views taken along the line IV—IV in FIG. 6 and showing the second half of process steps for fabricating a semiconductor device according to the second embodiment.
Figure 5B:
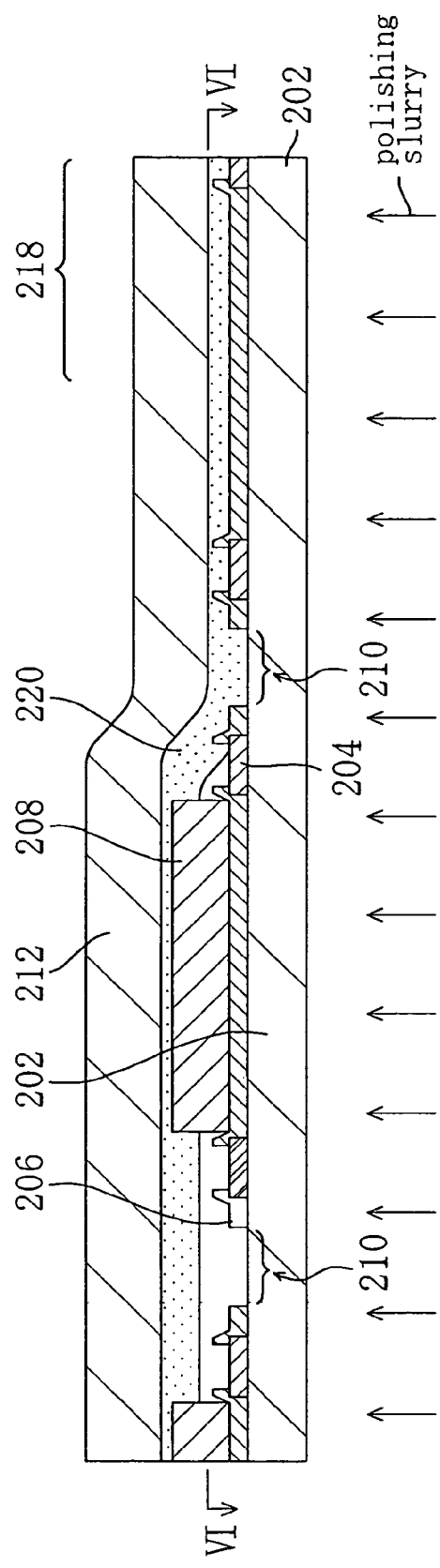
Figure 6:
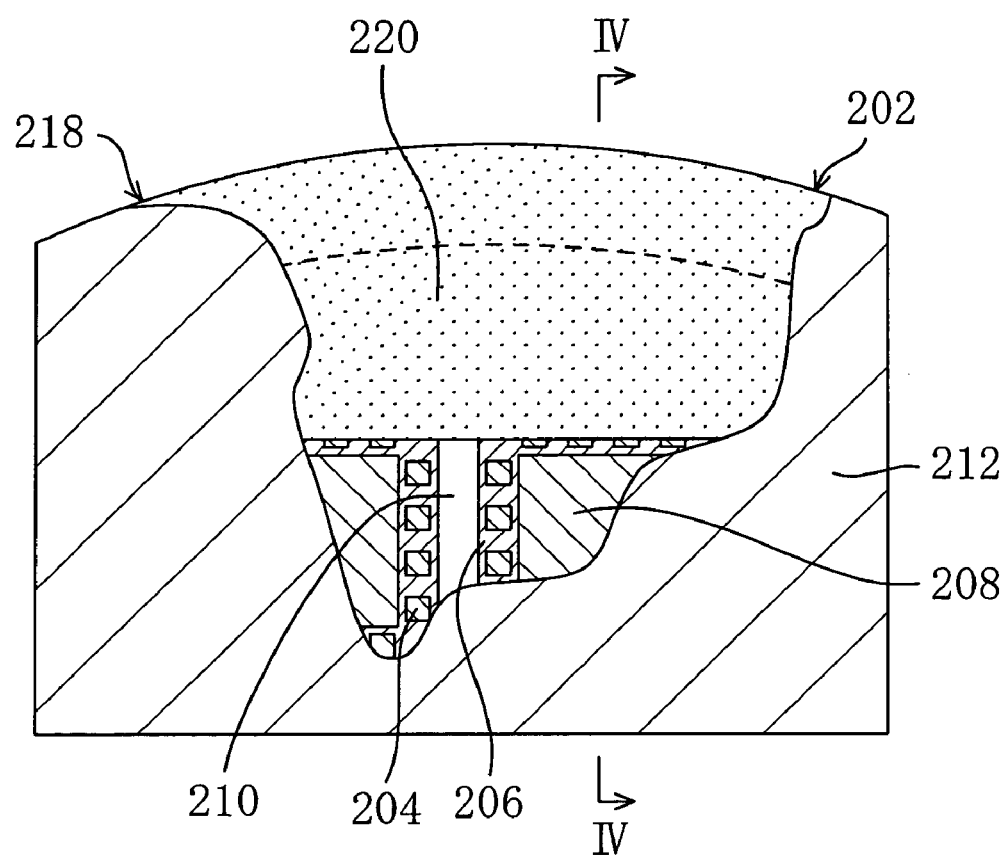
FIG. 6 is a plan view showing the periphery region of the wafer in the process step shown in FIG. 5B with part of the periphery region being taken along the line VI—VI.

FIGS. 4A to 5B are cross sectional views taken along the line IV—IV in FIG. 6 and showing process steps for fabricating a semiconductor device according to a second embodiment. FIG. 6 is a plan view showing the periphery region of the wafer in the process step shown in FIG. 5B with part of the periphery region being taken along the line VI—VI.

First, in the process step shown in FIG. 4A, a conductive film made of an aluminum alloy film is deposited above a wafer 202 on which semiconductor elements (not shown) such as transistors are formed and then a multilevel interconnect layer (not shown) is formed above the semiconductor elements, for example, by sputtering. Thereafter, the conductive film is patterned by lithography and dry etching so that bonding pads 204 are formed. Each of the bonding pads 204 is connected to the semiconductor element located below via an interconnect, a plug or the like. Next, a passivation film 206 made of a silicon nitride film is deposited above the wafer 202 by CVD (chemical vapor deposition), so as to cover the bonding pads 204. Thereafter, apertures 206a including regions of the passivation film 206 located above scribe line regions of the wafer and apertures 206b including regions of the passivation film 206 located above parts of the bonding pads 204 are formed in the passivation film 206 by lithography and dry etching.

Next, in the process step shown in FIG. 4B, a buffer coat film 208 of approximately 6 μm thickness made of a positive-type photosensitive material is formed over the whole substrate by a spin coating method. Thereafter, parts of the buffer coat film 208 respectively located on the bonding pads 204 and the scribe line regions 210 are removed by lithography, thereby forming apertures 208a. Concurrently, as shown in FIG. 6, a part of the buffer coat film 208 located on the periphery region 218 with a width of 3 mm from the edge of the wafer 202 is removed. This removal of the part of the buffer coat film 208 located on the periphery region 218 is performed as follows: when the positive-type photosensitive material is employed, the whole periphery region 218 is exposed at the timing that a pattern is transferred on the wafer 202 by exposure so that the buffer coat film 208 is sensitized.

As a result, the buffer coat film 208 never exists in chip regions at least partly located on the periphery region 218 but is left on the regions of the passivation film 206 (transistor formation regions) each surrounded by a certain number of the bonding pads 204.

Next, in the process step shown in FIG. 5A, a surface protection tape 212 is bonded to the top of the wafer, above which the buffer coat film 208 is formed, using adhesive paste 220 adhered to the rear surface of the surface protection tape 212. The adhesive paste 220 has a thickness of 15 µm.

Next, in the process step shown in FIG. 5B, the rear surface of the wafer 202 is polished using the surface protection tape 212 as a protection film until the wafer has a predetermined thickness. This polishing process is performed using polishing slurry obtained by dispersing abrasives into liquid, and the generated swarf is eliminated together with the polishing slurry.

Thereafter, after removing the surface protection tape 212, the scribe line regions 210 of the wafer 202 are scribed to divide the wafer into individual chips, and each chip is assembled into a semiconductor device.

According to the method for fabricating a semiconductor device of this second embodiment, a part of the buffer coat film 208 located on the chip regions lying on the periphery region 218 is removed, thereby, as shown in FIG. 6, bonding the surface protection tape 212 to the passivation film 206 and the scribe line regions 210 in the wafer periphery region 218 by the adhesive paste 220 without creating a gap from them. Therefore, the polishing slurry used for the process step shown in FIG. 5B (rear surface polishing process step) can be prevented from permeating into the apertures 208a (scribe line regions 210) of the buffer coat film 208 due to capillarity. This avoids contamination of the bonding pads 204 of the wafer 202 which would be caused by contact with the polishing slurry including swarf.

(Embodiment 3)

Figure 7A:
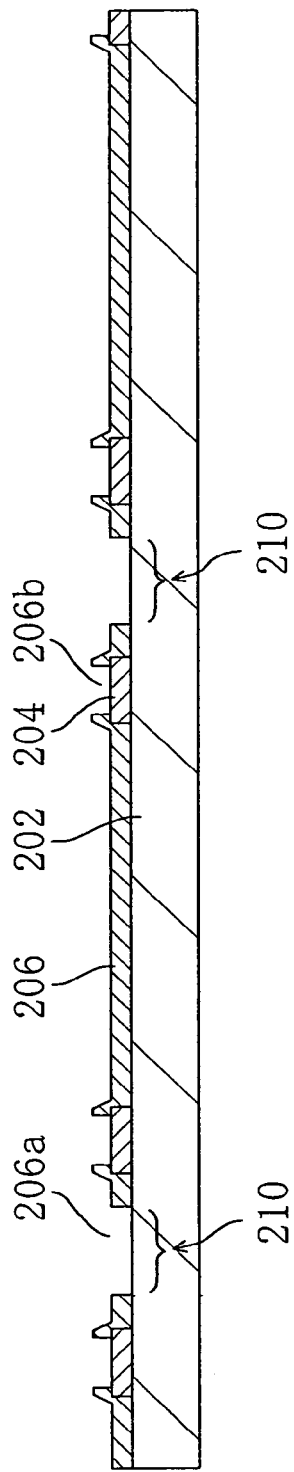
FIGS. 7A and 7B are cross sectional views taken along the line VII—VII in FIG. 9 and showing the first half of process steps for fabricating a semiconductor device according to a third embodiment.
Figure 7B:
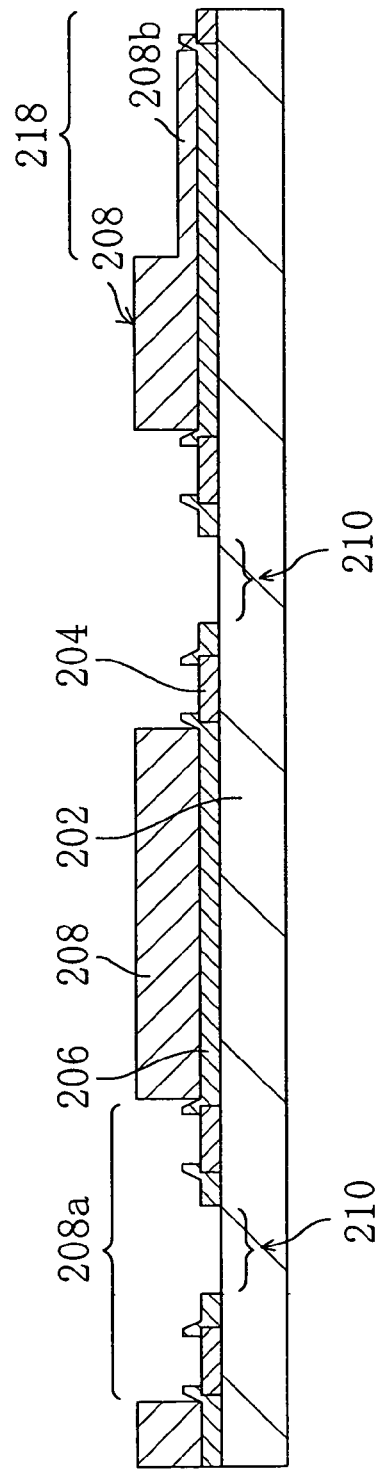
Figure 8A:
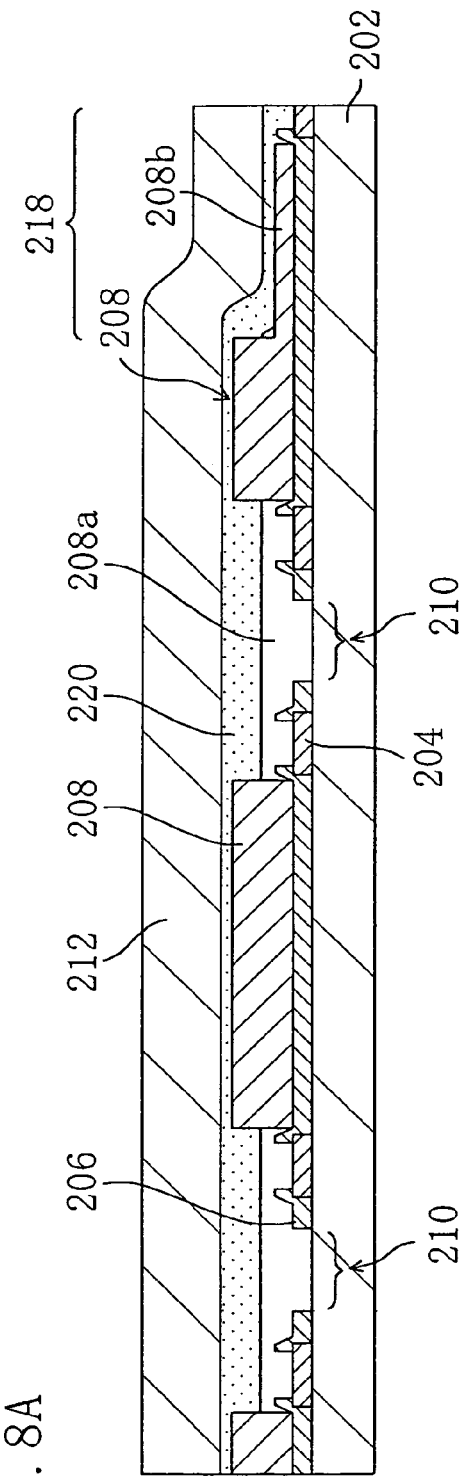
FIGS. 8A and 8B are cross sectional views taken along the line VII—VII in FIG. 9 and showing the second half of process steps for fabricating a semiconductor device according to the third embodiment.
Figure 8B:
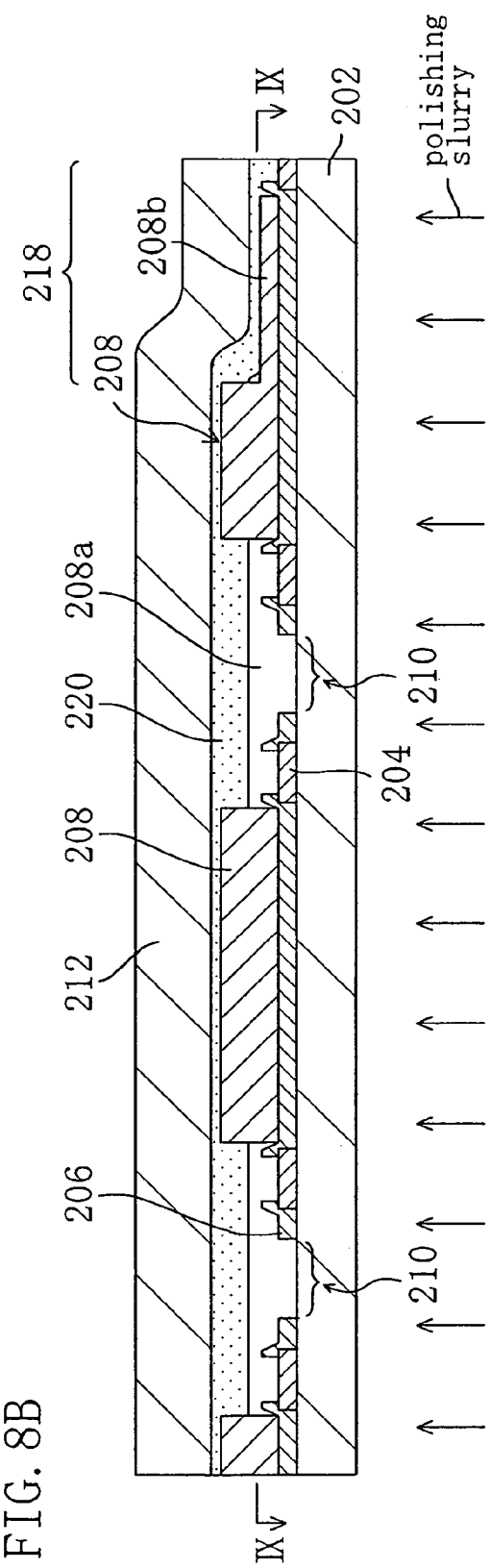
Figure 9:
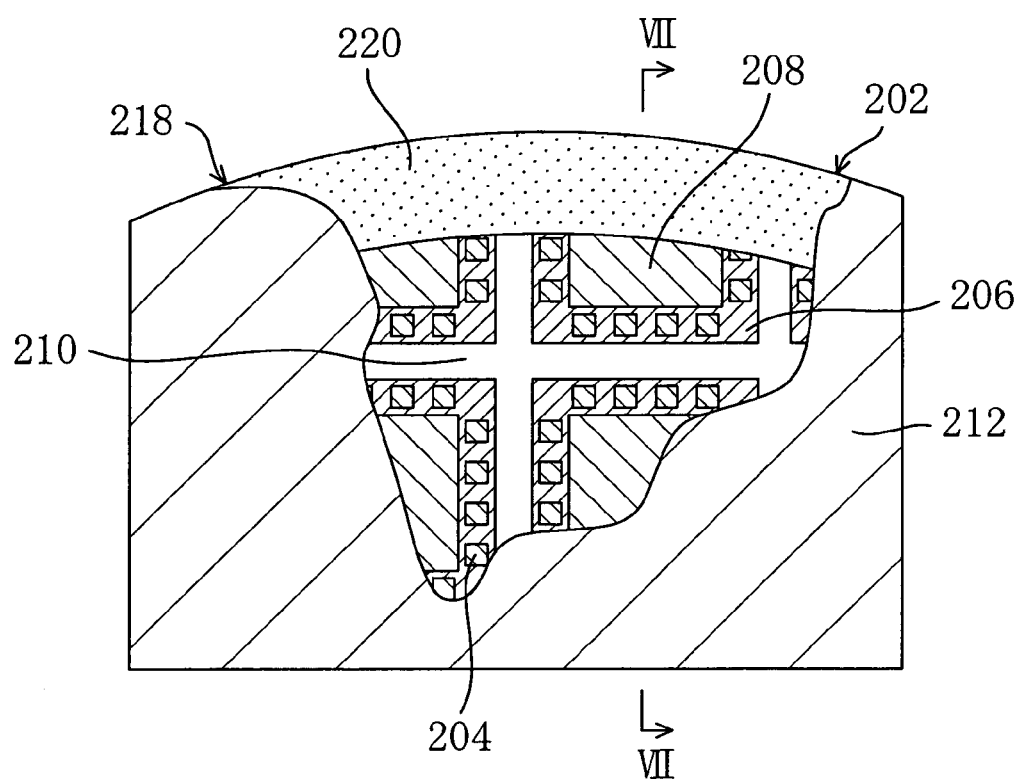
FIG. 9 is a plan view showing the periphery region of the wafer in the process step shown in FIG. 8B with part of the periphery region being taken along the line IX—IX.

FIGS. 7A to 8B are cross sectional views taken along the line VII—VII in FIG. 9 and showing process steps for fabricating a semiconductor device according to a third embodiment. FIG. 9 is a plan view showing the periphery region of the wafer in the process step shown in FIG. 8B with part of the periphery region being taken along the line IX—IX.

First, in the process step shown in FIG. 7A, a conductive film made of an aluminum alloy film is deposited above a wafer 202 on which semiconductor elements (not shown) such as transistors are formed and then a multilevel interconnect layer (not shown) is formed above the semiconductor elements, for example, by sputtering. Thereafter, the conductive film is patterned by lithography and dry etching so that bonding pads 204 are formed. Each of the bonding pads 204 is connected to the semiconductor element located below via an interconnect, a plug or the like. Next, a passivation film 206 made of a silicon nitride film is deposited above the wafer 202 by CVD (chemical vapor deposition), so as to cover the bonding pads 204. Thereafter, apertures 206a including regions of the passivation film 206 located above scribe line regions of the wafer and apertures 206b including regions of the passivation film 206 located above parts of the bonding pads 204 are formed in the passivation film 206 by lithography and dry etching.

Next, in the process step shown in FIG. 7B, a buffer coat film 208 of approximately 6 µm thickness made of a positive-type photosensitive material is formed over the whole substrate by a spin coating method. Thereafter, parts of the buffer coat film 208 respectively located on the bonding pads 204 and the scribe line regions 210 are removed by lithography, thereby forming apertures 208a. At this time, after the wafer is coated with the photosensitive material, nitrogen or air is blown on a part of the buffer coat film 208 located on the periphery region 218 with a width of 3 mm from the edge of the wafer 202, whereby the part of the buffer coat film 208 forms a thin part 208b having a thickness of 3 µm or less as shown in FIG. 9.

Next, in the process step shown in FIG. 8A, a surface protection tape 212 is bonded to the top of the wafer, above which the buffer coat film 208 is formed, using adhesive paste 220 adhered to the rear surface of the surface protection tape 212. The adhesive paste 220 has a thickness of 15 µm.

Next, in the process step shown in FIG. 8B, the rear surface of the wafer 202 is polished using the surface protection tape 212 as a protection film until the wafer has a predetermined thickness. This polishing process is performed using polishing slurry obtained by dispersing abrasives into liquid, and the generated swarf is eliminated together with the polishing slurry.

Thereafter, after removing the surface protection tape 212, the scribe line regions 210 of the wafer 202 are scribed to divide the wafer into individual chips, and each chip is assembled into a semiconductor device.

According to the method for fabricating a semiconductor device of this third embodiment, nitrogen or air is blown on the buffer coat film after the coating of the buffer coat film but before exposure, whereby a part of the buffer coat film 208 located on the periphery region 218 (thin part 208b) has a thickness of 3 µm thinner than a thickness of 6 µm which is the thickness of the other parts. Thus, in the periphery region 218, the surface protection tape 212 is bonded to the passivation film 206 and the scribe line regions 210 by the adhesive paste 220 without creating a gap from them, as shown in FIGS. 8B and 9. Therefore, the polishing slurry used for the process step shown in FIG. 8B (rear surface polishing process step) can be prevented from permeating into the apertures 208a (scribe line regions 210) of the buffer coat film 208 due to capillarity. This avoids contamination of the bonding pads 204 of the wafer 202 which would be caused by contact with the polishing slurry including swarf.

Although in the third embodiment the part of the buffer coat film 208 located on the periphery region 218 (thin part 208b) has a thickness of 3 µm or less, as described in the other example of the first embodiment, nitrogen or air can be blown on the buffer coat film after the coating of the buffer coat film but before exposure, thereby completely removing the part of the buffer coat film 208 located on the periphery region 218.

In both of the case where the photosensitive material is employed and the case where a material other than the photosensitive material is employed, the part of the buffer coat film 208 located on the periphery region may be thinned by polishing.

(Embodiment 4)

Figure 10A:
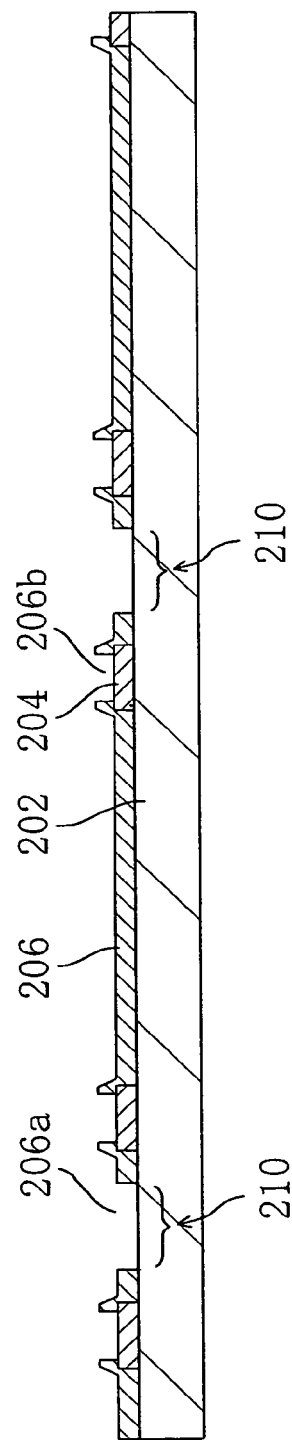
FIGS. 10A and 10B are cross sectional views taken along the line X—X in FIG. 12 and showing the first half of process steps for fabricating a semiconductor device according to a fourth embodiment.
Figure 10B:
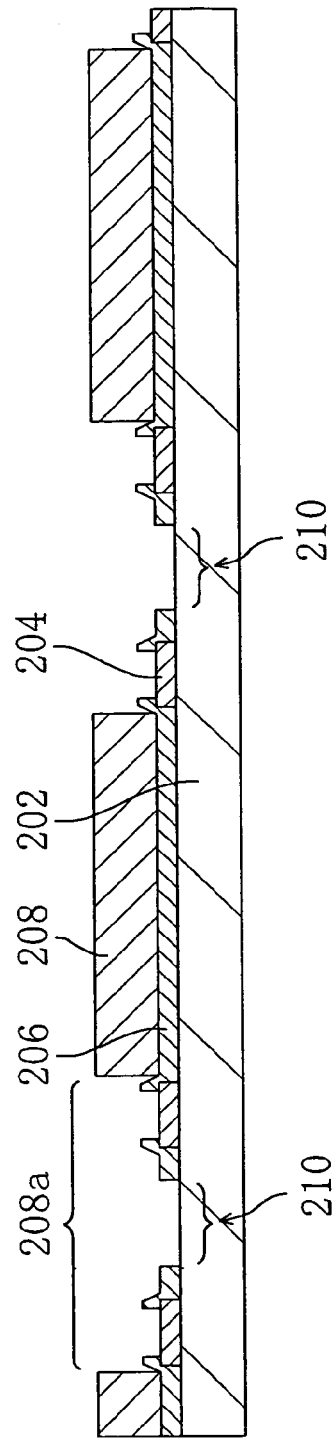
Figure 11A:
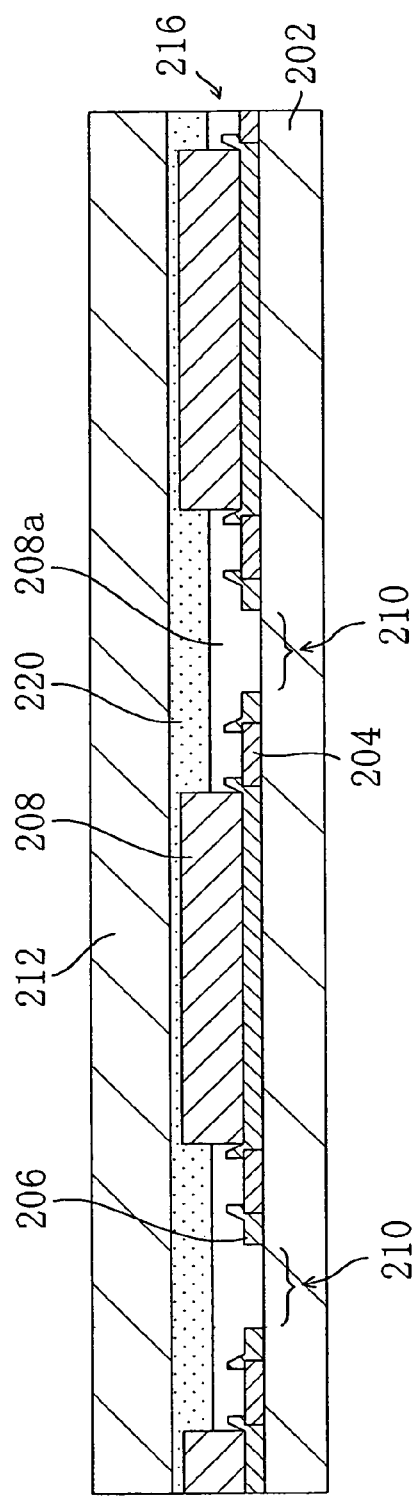
FIGS. 11A and 11B are cross sectional views taken along the line X—X in FIG. 12 and showing the second half of process steps for fabricating a semiconductor device according to the fourth embodiment.
Figure 11B:
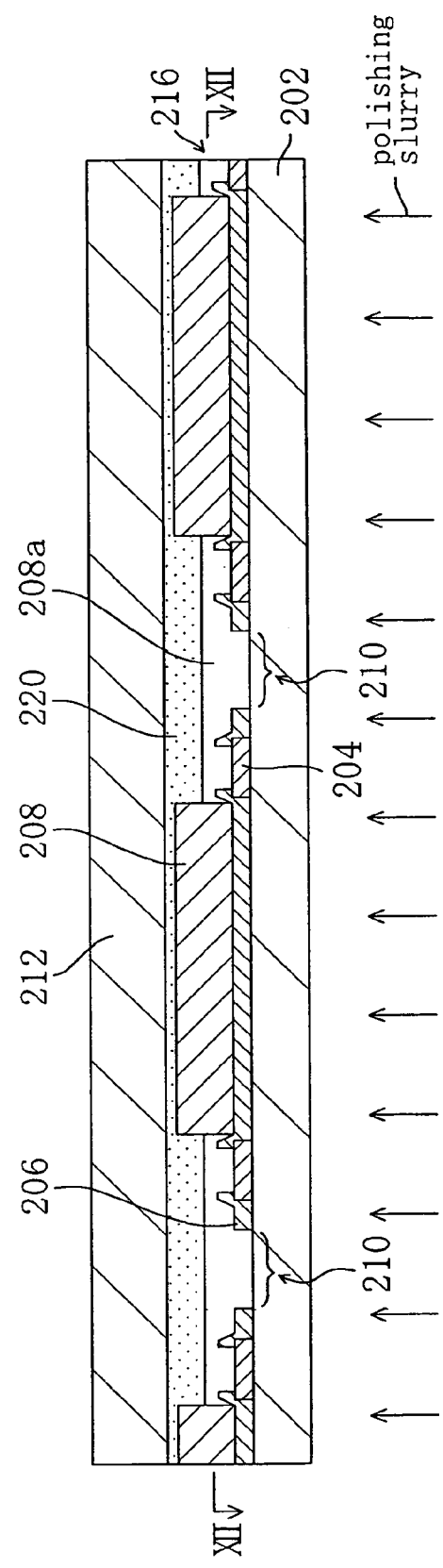
Figure 12:
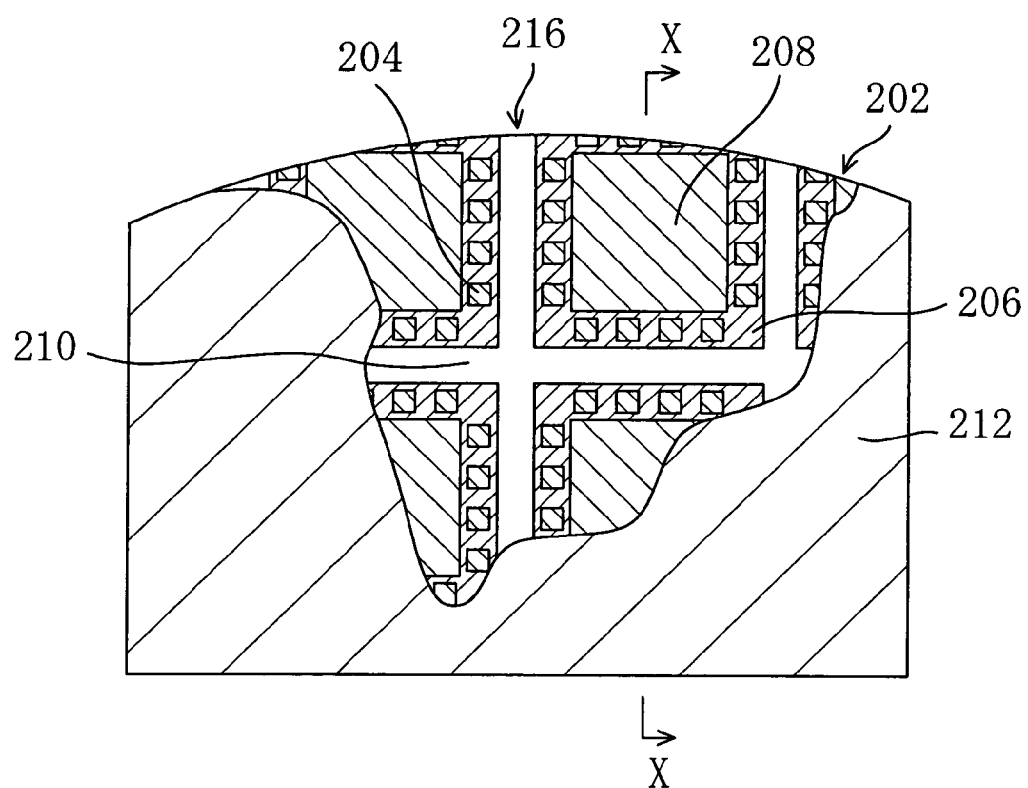
FIG. 12 is a plan view showing the periphery region of the wafer in the process step shown in FIG. 11B with part of the periphery region being taken along the line XII—XII.

FIGS. 10A to 11B are cross sectional views taken along the line X—X in FIG. 12 and showing process steps for fabricating a semiconductor device according to a fourth embodiment. FIG. 12 is a plan view showing the periphery region of the wafer in the process step shown in FIG. 11B with part of the periphery region being taken along the line XII—XII.

First, in the process step shown in FIG. 10A, a conductive film made of an aluminum alloy film is deposited above a wafer 202 on which semiconductor elements (not shown) such as transistors are formed and then a multilevel interconnect layer (not shown) is formed above the semiconductor elements, for example, by sputtering. Thereafter, the conductive film is patterned by lithography and dry etching so that bonding pads 204 are formed. Each of the bonding pads 204 is connected to the semiconductor element located below via an interconnect, a plug or the like. Next, a passivation film 206 made of a silicon nitride film is deposited above the wafer 202 by CVD (chemical vapor deposition), so as to cover the bonding pads 204. Thereafter, apertures 206a including regions of the passivation film 206 located above scribe line regions of the wafer and apertures 206b including regions of the passivation film 206 located above parts of the bonding pads 204 are formed in the passivation film 206 by lithography and dry etching.

Next, in the process step shown in FIG. 10B, a buffer coat film 208 of approximately 6 µm thickness made of a positive-type photosensitive material is formed over the whole substrate by a spin coating method. Thereafter, parts of the buffer coat film 208 respectively located on the bonding pads 204 and the scribe line regions 210 are removed by lithography, thereby forming apertures 208a.

Next, in the process step shown in FIG. 11A, a surface protection tape 212 is bonded to the top of the wafer, above which the buffer coat film 208 is formed, using adhesive paste 220 adhered to the rear surface of the surface protection tape 212. The adhesive paste 220 has a thickness of 15 µm.

Next, in the process step shown in FIG. 11B, the rear surface of the wafer 202 is polished using the surface protection tape 212 as a protection film until the wafer has a predetermined thickness. This polishing process is performed using polishing slurry obtained by dispersing abrasives into liquid having a viscosity of 4 mm$^2$/sec, and the generated swarf is eliminated together with the polishing slurry. One obtained by adding polyethylene glycol to pure water is used for this polishing slurry.

Thereafter, after removing the surface protection tape 212, the scribe line regions 210 of the wafer 202 are scribed to divide the wafer into individual chips, and each chip is assembled into a semiconductor device.

Figure 22:
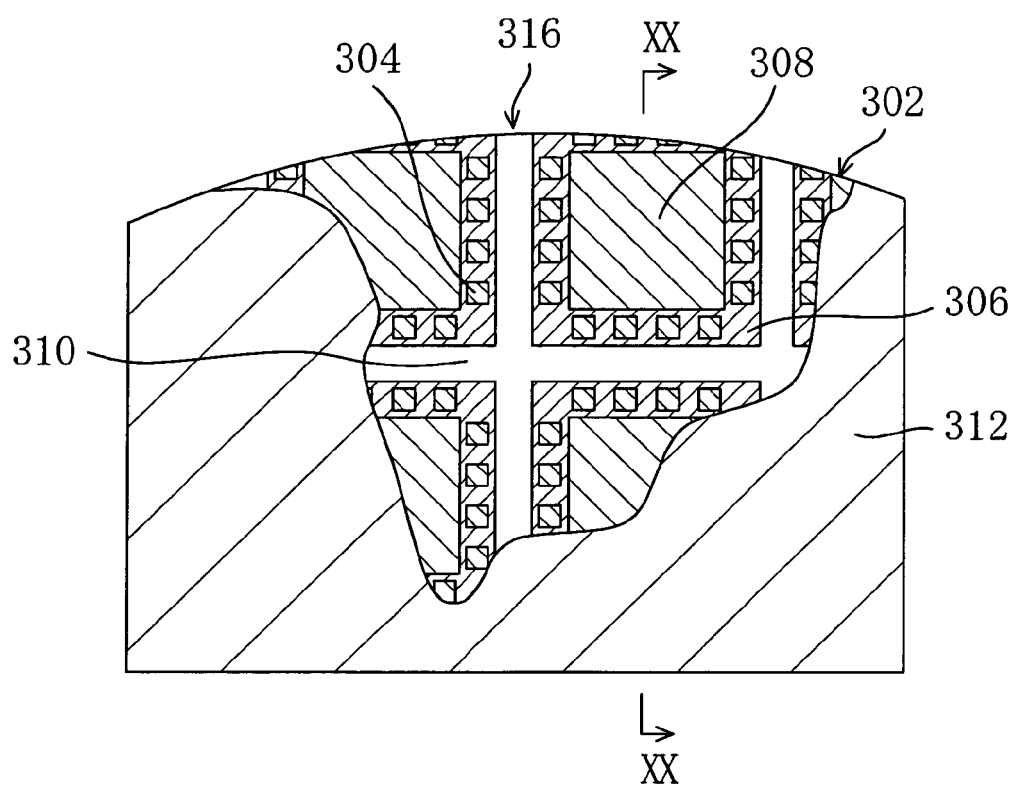
FIG. 22 is a plan view showing the periphery region of the wafer in the process step shown in FIG. 21B with part of the periphery region being taken along the line XXII—XXII.

In the rear surface polishing process step of the known semiconductor device shown in FIG. 19B, the polishing slurry has been adjusted using pure water having a viscosity of 1 mm$^2$/sec. Therefore, as shown in FIG. 22, there has been caused contamination of the bonding pads 304 due to permeation of the polishing slurry from the periphery of the wafer 302 to the top of the scribe lines 310 of the wafer 302 and the bonding pads 304 in the permeating direction 316.

However, according to the method for fabricating a semiconductor device of this fourth embodiment, pure water, a liquid obtained by adding polyethylene glycol to pure water, or polyethylene glycol is employed as the polishing slurry in the rear surface polishing process step, thereby enhancing the viscosity of the polishing slurry to approximately 4 mm$^2$/sec. Therefore, in the process step (rear surface polishing process step) shown in FIG. 11B, even when the adhesive paste 220 for the surface protection tape 212 is not kept in close contact with the wafer in the apertures 208a (scribe line regions 210) of the buffer coat film 208, the polishing slurry used can be prevented from permeating into the apertures 208a (scribe line regions 210) of the buffer coat film 208 due to capillarity. This avoids contamination of the bonding pads 204 of the wafer 202 which would be caused by contact with the polishing slurry including swarf.

In order to achieve the effects of the fourth embodiment, the viscosity of the polishing slurry employed in the rear surface polishing process step is required to be 3 mm$^2$/sec or more but 10 mm$^2$/sec or less.

(Embodiment 5)

Figure 15:
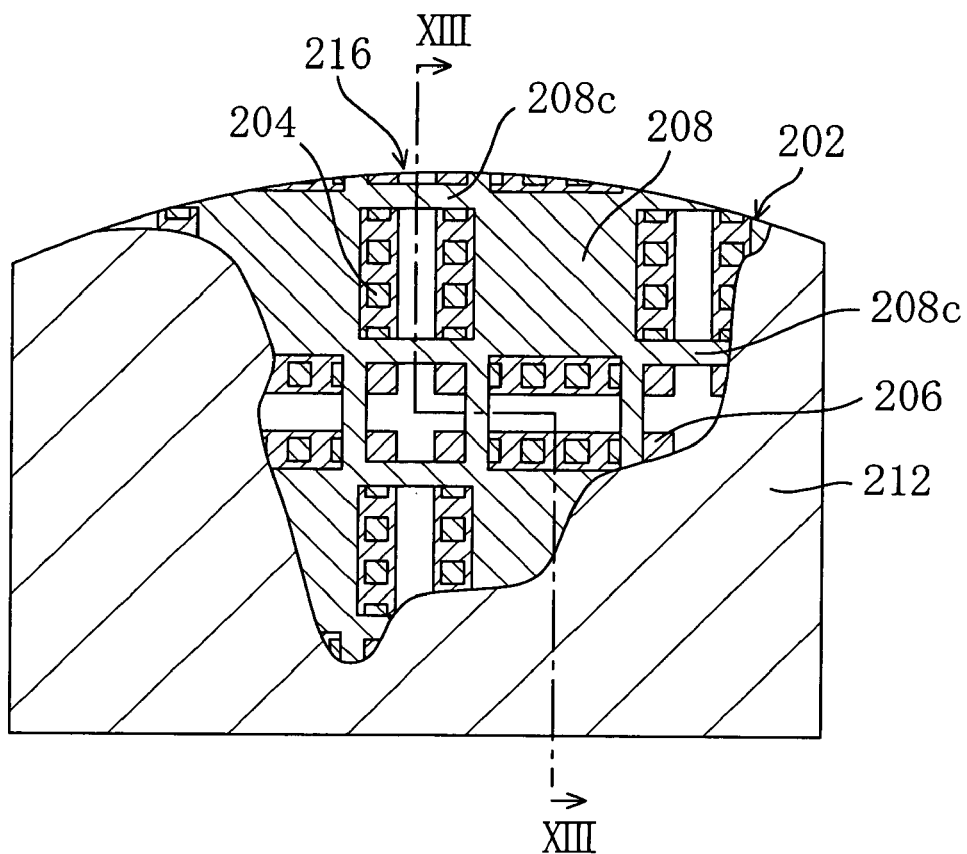
FIG. 15 is a plan view showing the periphery region of the wafer in the process step shown in FIG. 14B with part of the periphery region being taken along the line XV—XV.

FIGS. 13A to 14B are cross sectional views taken along the line XIII—XIII in FIG. 15 and showing process steps for fabricating a semiconductor device according to a fifth embodiment. FIG. 15 is a plan view showing the periphery region of the wafer in the process step shown in FIG. 14B with part of the periphery region being taken along the line XV—XV.

Figure 13A:
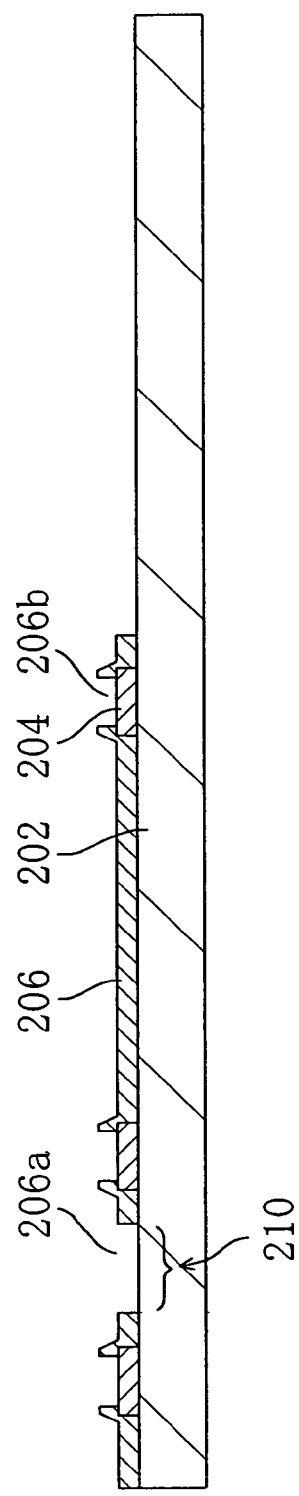
FIGS. 13A and 13B are cross sectional views taken along the line XIII—XIII in FIG. 15 and showing the first half of process steps for fabricating a semiconductor device according to a fifth embodiment.

First, in the process step shown in FIG. 13A, a conductive film made of an aluminum alloy film is deposited above a wafer 202 on which semiconductor elements (not shown) such as transistors are formed and then a multilevel interconnect layer (not shown) is formed above the semiconductor elements, for example, by sputtering. Thereafter, the conductive film is patterned by lithography and dry etching so that bonding pads 204 are formed. Each of the bonding pads 204 is connected to the semiconductor element located below via an interconnect, a plug or the like. Next, a passivation film 206 made of a silicon nitride film is deposited above the wafer 202 by CVD (chemical vapor deposition), so as to cover the bonding pads 204. Thereafter, apertures 206a including regions of the passivation film 206 located above scribe line regions of the wafer and apertures 206b including regions of the passivation film 206 located above parts of the bonding pads 204 are formed in the passivation film 206 by lithography and dry etching.

Figure 13B:
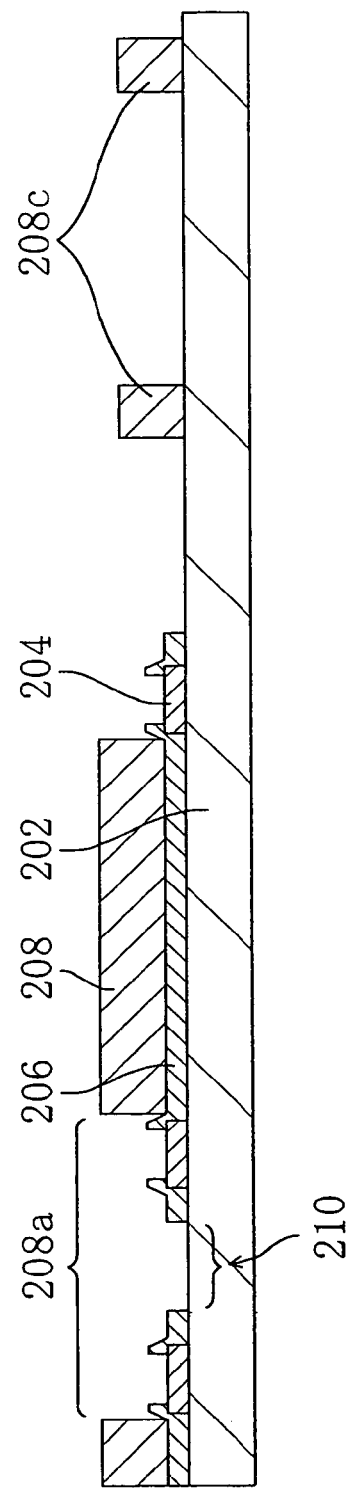

Next, in the process step shown in FIG. 13B, a buffer coat film 208 of approximately 6 µm thickness made of a positive-type photosensitive material is formed over the whole substrate by a spin coating method. Thereafter, parts of the buffer coat film 208 respectively located on the bonding pads 204 and the scribe line regions 210 are removed by lithography, thereby forming apertures 208a. At this time, as shown in FIG. 15, connection parts 208c are formed so as to partly connect both pattern units of the buffer coat film 208 located on every adjacent chips. It is desirable that, as shown in FIG. 15, the connection parts 208c connecting the adjacent chip regions be formed by connecting four corners of each chip. Thereby, in the next process step, each of the apertures 208a (scribe lines) of the buffer coat film 208 can be surely blocked.

Next, in the process step shown in FIG. 14A, a surface protection tape 212 is bonded to the top of the wafer, above which the buffer coat film 208 is formed, using adhesive paste 220 adhered to the rear surface of the surface protection tape 212. The adhesive paste 220 has a thickness of 15 µm.

Next, in the process step shown in FIG. 14B, the rear surface of the wafer 202 is polished using the surface protection tape 212 as a protection film until the wafer has a predetermined thickness.

According to the method for fabricating a semiconductor device of this fifth embodiment, the buffer coat film 208 connects at the connection parts 208c between every adjacent chip regions. Therefore, in the process step shown in FIG. 14B (rear surface polishing process step), the polishing slurry can be prevented from permeating into the apertures 208a (scribe line regions 210) of the buffer coat film 208 due to capillarity. This avoids contamination of the bonding pads 204 of the wafer 202 which would be caused by contact with the polishing slurry including swarf.

(Embodiment 6)

Figure 18:
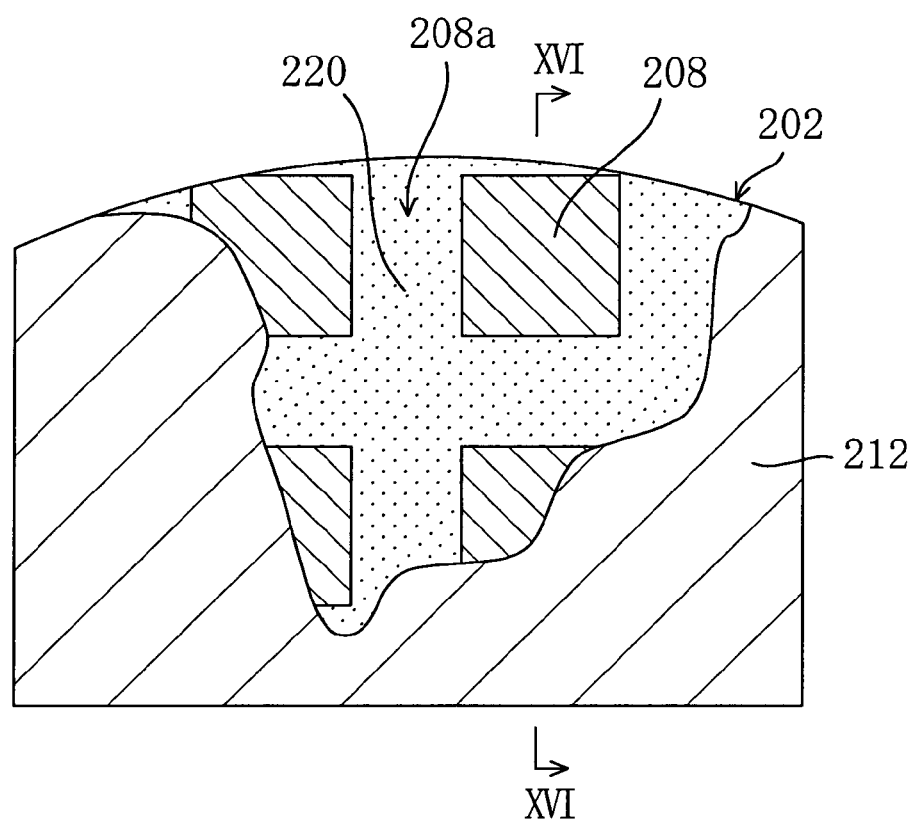
FIG. 18 is a plan view showing the periphery region of the wafer in the process step shown in FIG. 17B with part of the periphery region being taken along the line XVIII—XVIII.

FIGS. 16A to 17B are cross sectional views taken along the line XVI—XVI in FIG. 18 and showing process steps for fabricating a semiconductor device according to a sixth embodiment. FIG. 18 is a plan view showing the periphery region of the wafer in the process step shown in FIG. 17B with part of the periphery region being taken along the line XVIII—XVIII.

Figure 16A:
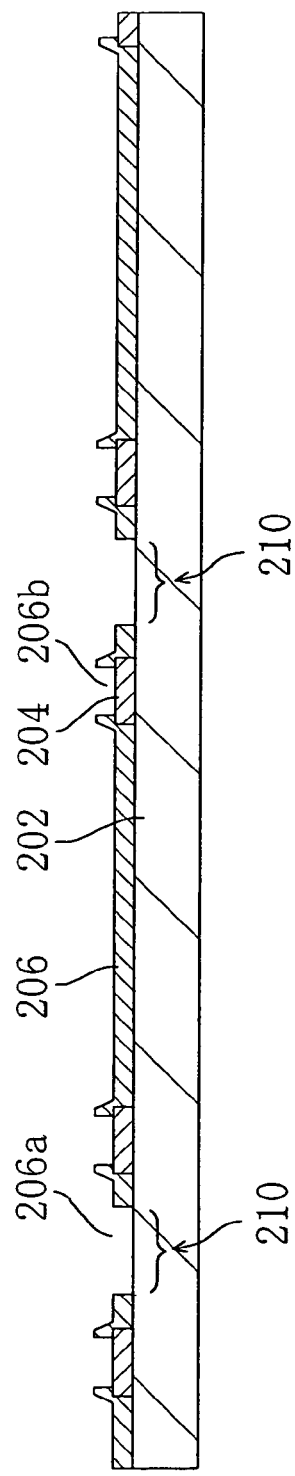
FIGS. 16A and 16B are cross sectional views taken along the line XVI—XVI in FIG. 18 and showing the first half of process steps for fabricating a semiconductor device according to a sixth embodiment.

First, in the process step shown in FIG. 16A, a conductive film made of an aluminum alloy film is deposited above a wafer 202 on which semiconductor elements (not shown) such as transistors are formed and then a multilevel interconnect layer (not shown) is formed above the semiconductor elements, for example, by sputtering. Thereafter, the conductive film is patterned by lithography and dry etching so that bonding pads 204 are formed. Each of the bonding pads 204 is connected to the semiconductor element located below via an interconnect, a plug or the like. Next, a passivation film 206 made of a silicon nitride film is deposited above the wafer 202 by CVD (chemical vapor deposition), so as to cover the bonding pads 204. Thereafter, apertures 206a including regions of the passivation film 206 located above scribe line regions of the wafer and apertures 206b including regions of the passivation film 206 located above parts of the bonding pads 204 are formed in the passivation film 206 by lithography and dry etching.

Figure 16B:
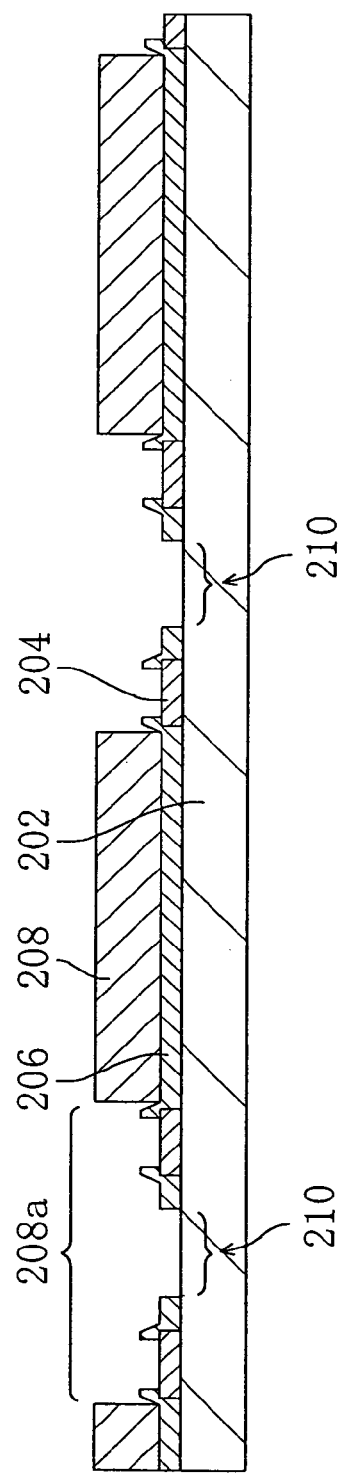

Next, in the process step shown in FIG. 16B, a buffer coat film 208 of approximately 6 μm thickness made of a positive-type photosensitive material is formed over the whole substrate by a spin coating method. Thereafter, parts of the buffer coat film 208 respectively located on the bonding pads 204 and the scribe line regions 210 are removed by lithography, thereby forming apertures 208a.

Next, in the process step shown in FIG. 17A, a surface protection tape 212 is bonded to the top of the wafer, above which the buffer coat film 208 is formed, using adhesive paste 220 adhered to the rear surface of the surface protection tape 212. The adhesive paste 220 has a thickness of 30 μm.

Next, in the process step shown in FIG. 17B, the rear surface of the wafer 202 is polished using the surface protection tape 212 as a protection film until the wafer has a predetermined thickness.

According to the method for fabricating a semiconductor device of this sixth embodiment, the thickness of the adhesive paste which has conventionally been just 15 μm is changed to 30 μm, thereby, as shown in FIG. 17B, filling a gap located in the apertures 208a of the buffer coat film 208 between the wafer 202 and the surface protection tape film 212 with the adhesive paste 221. Therefore, in the process step shown in FIG. 17B (rear surface polishing process step), the polishing slurry can be prevented from permeating into the apertures 208a (scribe line regions 210) of the buffer coat film 208 due to capillarity. This avoids contamination of the bonding pads 204 of the wafer 202 which would be caused by contact with the polishing slurry including swarf.

Although in the sixth embodiment the thickness of the adhesive paste 221 of the surface protection tape 212 is 30 μm, it is only required to be 20 μm or more but 50 μm or less.

Alternatively, the regions of the adhesive paste 221 for the surface protection tape 212 corresponding to the pattern of the scribe line regions 210 on the wafer 202 may have a thickness of 20 μm or more but 50 μm or less, and the other regions of the adhesive paste 221 may have a thickness of 15 μm. In this way, only the regions of the adhesive paste 221 corresponding to the scribe line regions 210 (recess parts) formed on the wafer 202 are increased in thickness, thereby making it possible to bond the wafer 202 and the surface protection tape 212 to each other without producing a gap therebetween.

Although in the first to sixth embodiments the buffer coat film 208 is formed by using polybenzoxazole (PBO) as a positive-type photosensitive material, the buffer coat film 208 may be formed by using an organic resin other than PBO.

Although in the first to sixth embodiments the periphery region 218 has a width of 3 mm from the edge of the wafer 202, the periphery region 218 may have any width between 2 mm and 10 mm from the edge of the wafer 202, thereby achieving the effects of the respective embodiments.

What is claimed is:

1. A method for fabricating a semiconductor device, said method comprising the steps of:
    (a) forming bonding pads above a wafer on which semiconductor elements and an interconnect layer are formed;
    (b) forming a passivation film having apertures including regions of the passivation film located above parts of the bonding pads and scribe line regions after the step (a);
    (c) forming a buffer coat film for covering part of the passivation film after the step (b), and removing a region of the buffer coat film extending from an edge of the wafer and located on the whole periphery region having a certain distance from the periphery of the wafer;
    (d) forming, in the buffer coat film, apertures including regions of the buffer coat film above the scribe line regions and above the parts of the bonding pads, respectively;
    (e) bonding a surface protection tape to the wafer using an adhesive material which contacts the passivation film in the whole periphery region of the wafer after the step (d); and
    (f) polishing the rear surface of the wafer after the step (e).

2. The method for fabricating a semiconductor device of claim 1, wherein
    in the step (c), the buffer coat film is formed using a positive-type photosensitive material, and
    the step (d) includes a process for exposing part of the buffer coat film located on the periphery region of the wafer.

3. The method for fabricating a semiconductor device of claim 1, wherein
    in the step (c), the buffer coat film is formed using a positive-type photosensitive material, and
    the step (d) includes a process for exposing part of the buffer coat film located on the wholes of chip regions at least partly overlapped with the periphery region of the wafer.

4. The method for fabricating a semiconductor device of claim 1, wherein
    in the step (c), the buffer coat film is formed using an organic resin, and
    the step (d) includes a process for selectively removing part of the buffer coat film located on the periphery region of the wafer by a solvent.

5. The method for fabricating a semiconductor device of claim 1, wherein
    in the step (c), the buffer coat film is formed using an organic resin, and
    the step (d) includes a process for blowing gas on part of the buffer coat film located on the periphery region of the wafer before the curing of the buffer coat film.

6. The method for fabricating a semiconductor device of claim 1, wherein in the step (d), the whole periphery region refers to circular regions in the periphery of the wafer.

7. A method for fabricating a semiconductor device, said method comprising the steps of:
  (a) forming bonding pads above a wafer on which semiconductor elements and an interconnect layer are formed;
  (b) forming a passivation film having apertures including regions of the passivation film located above parts of the bonding pads after the step (a);
  (c) forming a buffer coat film for covering part of the passivation film after the step (b);
  (d) forming, in the buffer coat film, apertures including regions of the buffer coat film located above scribe line regions and above the parts of the bonding pads, respectively, and reducing the thickness of an outermost peripheral part of the buffer coat film located on the whole periphery region of the wafer having a certain distance from the periphery of the wafer;
  (e) bonding a surface protection tape to the wafer using an adhesive material after the step (d); and
  (f) polishing the rear surface of the wafer after the step (e).

8. The method for fabricating a semiconductor device of claim 7, wherein
  in the step (d), the thickness of part of the buffer coat film located on the periphery region is reduced to 3µm or less.

9. The method for fabricating a semiconductor device of claim 6, wherein in the step (d), the whole periphery region refers to circular regions in the periphery of the wafer.

10. A method for fabricating a semiconductor device, said method comprising the steps of:
  (a) forming bonding pads above a wafer on which semiconductor elements and an interconnect layer are formed;
  (b) forming a passivation film having apertures including regions of the passivation film located above parts of the bonding pads after the step (a);
  (c) forming a buffer coat film for covering part of the passivation film after the step (b);
  (d) forming, in the buffer coat film, apertures including regions of the buffer coat film located above a periphery region having a certain distance from the periphery of the wafer, above scribe line regions and above the parts of the bonding pads, respectively;
  (e) bonding a surface protection tape to the wafer using an adhesive material which contacts the passivation film in the whole periphery region of the wafer after the step (d); and
  (f) polishing the rear surface of the wafer after the step (e).

* * * * *